(12) United States Patent
Sohn et al.

(10) Patent No.: US 11,290,028 B2
(45) Date of Patent: Mar. 29, 2022

(54) POWER SUPPLY AND METHOD OF SUPPLYING POWER TO LOAD

(71) Applicant: EN2CORE TECHNOLOGY, INC., Daejeon (KR)

(72) Inventors: Yeong-Hoon Sohn, Sokcho-si (KR); Se-Hong Park, Busan (KR); Sae-Hoon Uhm, Hwaseong-si (KR)

(73) Assignee: EN2CORE TECHNOLOGY, INC., Daejeon (KR)

( * ) Notice: Subject to any disclaimer, the term of this patent is extended or adjusted under 35 U.S.C. 154(b) by 808 days.

(21) Appl. No.: 16/099,660

(22) PCT Filed: Jun. 11, 2018

(86) PCT No.: PCT/KR2018/006606
§ 371 (c)(1),
(2) Date: Nov. 7, 2018

(87) PCT Pub. No.: WO2018/236087
PCT Pub. Date: Dec. 27, 2018

(65) Prior Publication Data
US 2021/0226556 A1 Jul. 22, 2021

(30) Foreign Application Priority Data
Jun. 23, 2017 (KR) .......................... 10-2017-0079847

(51) Int. Cl.
*H02M 7/53* (2006.01)
*H02M 7/5387* (2007.01)
(Continued)

(52) U.S. Cl.
CPC ..... *H02M 7/5387* (2013.01); *H01J 37/32183* (2013.01); *H02M 1/4233* (2013.01); *H03H 7/40* (2013.01)

(58) Field of Classification Search
CPC .............. H02M 7/5387; H02M 1/4233; H01J 37/32183; H03H 7/40
See application file for complete search history.

(56) References Cited

U.S. PATENT DOCUMENTS 4,876,635 A 10/1989 Park et al.
6,979,914 B2 12/2005 McKelvey et al.
(Continued)

FOREIGN PATENT DOCUMENTS

CN 104917414 A 9/2015
DE 102011122103 A1 6/2013
(Continued)

OTHER PUBLICATIONS

Office Action, Japanese Application No. JP2019-555832, dated Nov. 17, 2020; 3 pgs.
(Continued)

*Primary Examiner* — Kyle J Moody
*Assistant Examiner* — Lakaisha Jackson
(74) *Attorney, Agent, or Firm* — Andrew D. Fortney; Central California IP Group, P.C.

(57) ABSTRACT

A power supply includes an inverter configured to direct current (DC) power into alternating current (AC) power, an impedance matching circuit configured to supply the AC power to a load; and a controller configured to adjust disposition of a powering period, in which the AC power is output, and a freewheeling period, in which the AC power is not output, to adjust a power amount of the power supplied to the load through the impedance matching circuit by the inverter.

20 Claims, 29 Drawing Sheets

(51) Int. Cl.
*H01J 37/32* (2006.01)
*H02M 1/42* (2007.01)
*H03H 7/40* (2006.01)

(56) References Cited

U.S. PATENT DOCUMENTS

| | | | |
|---|---|---|---|
| 9,355,822 | B2 | 5/2016 | Yamada et al. |
| 2004/0222640 | A1 | 11/2004 | McKelvey et al. |
| 2008/0101103 | A1 | 5/2008 | Sato |
| 2014/0361690 | A1 | 12/2014 | Yamada et al. |
| 2015/0009732 | A1 | 1/2015 | Turki et al. |
| 2021/0126554 | A1* | 4/2021 | Bianda ............... H02M 7/5387 |
| 2021/0152013 | A1* | 5/2021 | Mao .................... B60L 53/122 |
| 2021/0218328 | A1* | 7/2021 | Eguchi ............. H02M 7/53871 |
| 2021/0226555 | A1* | 7/2021 | Sohn .................. H02M 7/4815 |

FOREIGN PATENT DOCUMENTS

| | | | |
|---|---|---|---|
| EP | 1220438 | A2 | 7/2002 |
| EP | 1363474 | A2 | 11/2003 |
| EP | 2148421 | A1 | 1/2010 |
| JP | S5734697 | A | 2/1982 |
| JP | 59-202715 | A | 11/1984 |
| JP | 02184267 | A | 7/1990 |
| JP | 2000331798 | A | 11/2000 |
| JP | 2003331798 | A | 11/2003 |
| JP | 2004327117 | A | 11/2004 |
| JP | 2006230167 | A | 8/2006 |
| JP | 2008306926 | A | 12/2008 |
| JP | 2013-135159 | A | 7/2013 |
| JP | 2017079127 | A | 4/2017 |
| KR | 20100137753 | A | 12/2010 |

OTHER PUBLICATIONS

Office Action dated Dec. 8, 2020, CN201880026829.5; China National Intellectual Property Administration (CNIPA); 12 pgs.

Hisamoto Masaaki;"Control Method for High Frequency Power Supply"; Bibliographic Data of JP2000331798 (A); Nov. 30, 2000; http://worldwide.espacenet.com.

Extended European Search Report dated Feb. 10, 2021; European Patent Application No. 18820651.0; 10 pgs.; European Patent Office, Munich, Germany.

Hideaki Fujita et al: "Control and Performance of a Pulse-Density-Modulated Series-Resonant Inverter for Corona Discharge Processes"; IEEE Transactions on Industry Applications, vol. 35, No. 3, May/Jun. 1999; pp. 621-627.

Hideaki Fujita et al.: "Pulse-Density-Modulated Power Control of a 4 kW, 450 kHz Voltage-Source Inverter for Induction Melting Applications"; IEEE Transactions on Industry Applications, vol. 32, No. 2, Mar./Apr. 1996; pp. 279-286.

* cited by examiner

POWER SUPPLY AND METHOD OF SUPPLYING POWER TO LOAD

CROSS-REFERENCE TO RELATED APPLICATIONS

This application is a continuation of and claims priority to PCT/KR2018/006606 filed on Jun. 11, 2018, which claims priority to Korea Patent Application No. 10-2017-0079847 filed on Jun. 23, 2017, the entireties of which are both hereby incorporated by reference.

TECHNICAL FIELD

The present disclosure relates to electronic or electrical devices and, more particularly, to a power supply and a method of supplying power to a load.

BACKGROUND

Various electronic or electrical devices for use in living or industrial sites require a power supply. According to purposes, characteristics or use environment of electronic or electrical device, the electronic or electrical devices may require different types of power supply. Among the electronic or electrical devices, particularly, inductively coupled plasma (ICP) devices require an alternating current (AC) power supply having high power and a high frequency.

The amount of power or current supplied to an inductively coupled plasma device needs to be controlled to precisely control the operation of the inductively coupled plasma device. Various methods have been studied to control the amount of power current supplied to an inductively coupled plasma device. However, most of the methods increase the complexity, volume or price of a power supply. Alternatively, high-frequency switching noise is generated in a power supply or a stress is applied to the power supply to cause malfunction of the power supply. Thus, reliability of the power supply is reduced or life of the power supply is significantly reduced. Accordingly, there is a need for research into a power supply and a method of supplying power which do not increase complexity and do not cause high-frequency switching noise and a stress.

SUMMARY

Example embodiments of the present disclosure provide a power supply and a method of supplying power which have improved reliability without increasing complexity and causing high-frequency switching noise and stress.

A power supply according to an example embodiment of the present disclosure includes an inverter configured to direct current (DC) power into alternating current (AC) power, an impedance matching circuit configured to supply the AC power to a load; and a controller configured to adjust disposition of a powering period, in which the AC power is output, and a freewheeling period, in which the AC power is not output, to adjust a power amount of the power supplied to the load through the impedance matching circuit by the inverter.

In example embodiments, the controller may control the inverter to increase the freewheeling period when the power amount of the power supplied by the inverter is greater than a target power amount.

In example embodiments, the controller may control the inverter to decrease the freewheeling period when the power amount of the power supplied by the inverter is smaller than a target power amount.

In example embodiments, the controller may increase or decrease the freewheeling period step by step until the power amount of the power supplied by the inverter becomes equal to a target power amount.

In example embodiments, the controller may detect a difference between the power amount of the power supplied by the inverter and a target power amount and may adjust the freewheeling period according to the detected difference such that the power amount of the power supplied by the inverter becomes equal to a target power amount.

In example embodiments, the controller may calculate a difference between the power amount of the power supplied by the inverter and a target power amount as an error value and adjusts the freewheeling period using a current error value, previous error values, and proportional-integral-derivation (PID) gain factors.

In example embodiments, the controller may limit a length of the freewheeling period to a threshold value or less.

In example embodiments, the threshold value may be determined depending on a quality factor of the impedance matching circuit and the load and a period of the AC power.

In example embodiments, the controller may control placement of the powering period and the freewheeling period by placing a powering cell in which the AC power is supplied during at least one half cycle and a freewheeling cell in which the AC power is not supplied during at least one half cycle.

In example embodiments, the controller may be configured to alternately arrange the powering cell and the freewheeling cell.

In example embodiments, the controller may limit the number of successively arranged freewheeling cells to a threshold value or less.

In example embodiments, the controller may control placement of the powering period and the freewheeling period by placing a powering cell in which the AC power is supplied during at least one cycle and a freewheeling cell in which the AC power is not supplied and the AC power is supplied during at least one cycle.

In example embodiments, the load may be an inductively coupled plasma (ICP).

In example embodiments, the controller may control the inverter to supply positive voltage during a first half period, not to supply power during a second half period, to supply negative voltage during a third half period, and not to supply power during a fourth half period.

In example embodiments, the controller may control the inverter to supply positive voltage during a first half period, to supply negative voltage during a second half period, not to supply power during third and fourth half periods, to supply positive voltage during a fifth half period, not to supply power during sixth and seventh half period, and to supply negative voltage during an eighth half period.

In example embodiments, the inverter may include a first transistor and a first diode coupled in parallel between a power supply node and a first output node, a second transistor and a second diode coupled in parallel between the first output node and a ground node, a third transistor and a third diode coupled in parallel between the ground node and a second output node, a fourth transistor and a fourth diode coupled in parallel between the power supply node and the second output node, and an inductor coupled between the first output node and the second output node. The first output node and the second output node may be connected to the impedance matching circuit, and the controller may control respective voltages of gates of the first to fourth transistors.

In example embodiments, the controller may control the inverter such that signs of a voltage and a current of the AC power match each other and such that a positive peak value and a negative peak value of a current flowing through the inductor match each other.

A method of supply power to a load according to an example embodiment of the present disclosure includes receiving a target power amount, comparing a power amount of power supplied to the load with the target power amount, adjusting a powering period, in which alternating current (AC) power is supplied to the load, and a freewheeling period, in which the AC power is not supplied to the load, depending on a comparison result such that the target power amount and the power amount become equal to each other, and supplying power to the load according to the adjusted powering period and the adjusted freewheeling period.

In example embodiments, the powering period and the freewheeling period may be adjusted until the power amount and the target power amount become equal to each other.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
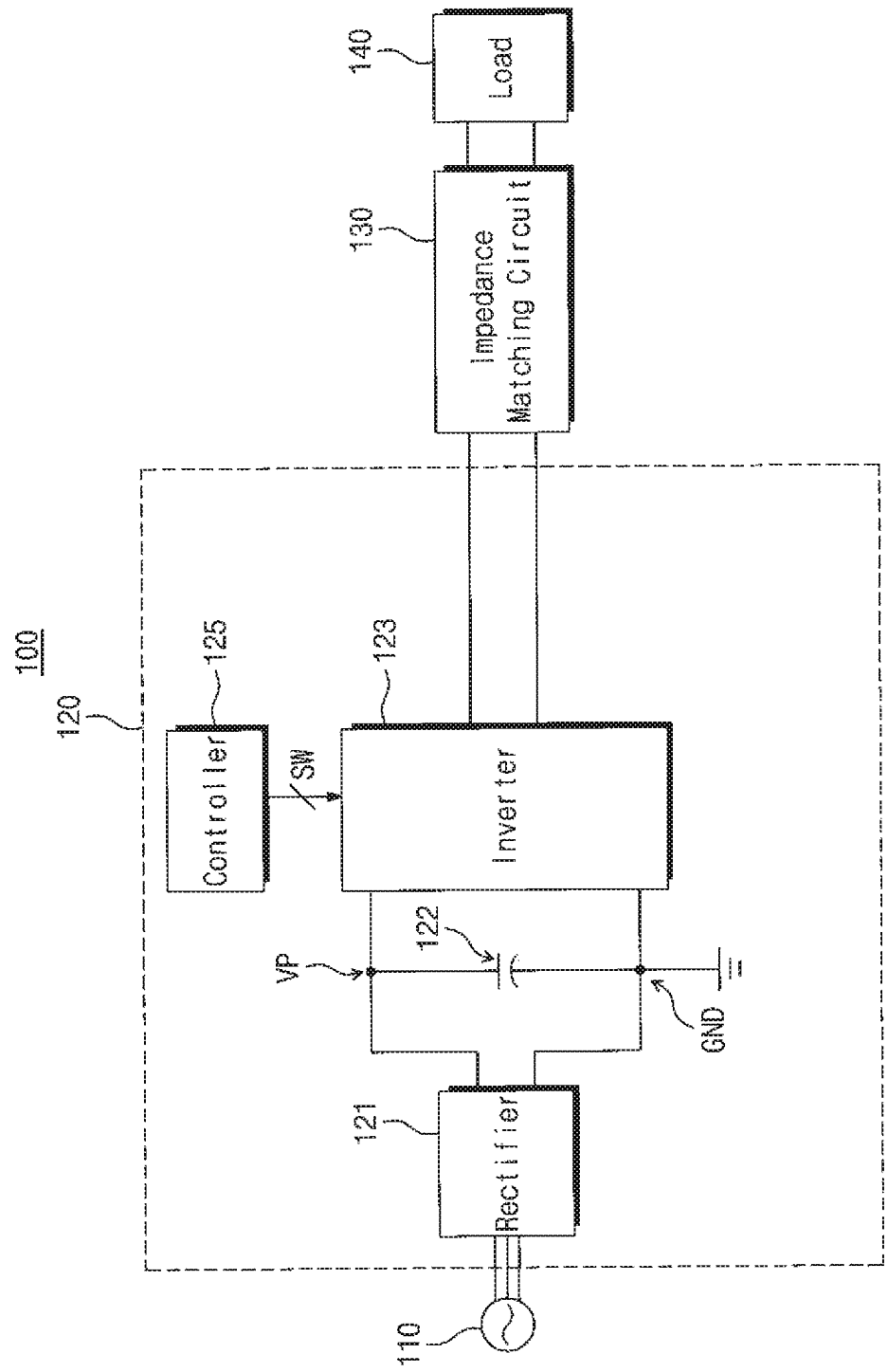
FIG. 1 is a block diagram of a power supply system according to an example embodiment of the present disclosure.

Example embodiments of the present disclosure will now be described below more fully with reference to accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art.

Reference numerals are indicated in detail in example embodiments of the present disclosure, and their examples are represented in reference drawings. In every possible case, like reference numerals are used for referring to the same or similar elements in the description and drawings.

FIG. 1 is a block diagram of a power supply system 100 according to an example embodiment of the present disclosure. Referring to FIG. 1, the power supply system 100 includes AC power 110, a power supply 120, and a load 140. The AC power 110 may be a 60 Hz power used in a house or an industrial field. The load 140 may be an electrical or electronic device used in a house or an industrial field. For example, the load 140 may be an inductively coupled plasma (ICP) device.

The power supply 120 may convert first AC power into second AC power and may supply the second AC power to the load 140. For example, the second AC power may have a frequency of several hundreds of kilohertz (kHz) to tens of megahertz (MHz) and may have power of several kilowatts (kW) or more. The power supply 120 may include a rectifier 121, a capacitor 122, an inverter 123, an impedance matching circuit 130, and a controller 125.

The rectifier 121 may convert an output of the AC power 110 into DC power. For example, the rectifier 121 may supply DC power between a ground node GND and a power supply node VP. The capacitor 122 may be connected between the power supply node VP and the ground node GND. The capacitor 122 may discharge an AC component transmitted to the power supply node VP to the ground node GND.

The inverter 123 may receive the DC power from the power supply node VP and the ground node GND. The inverter 123 may receive switching signals SW from the controller 125. The inverter 123 may convert the DC power into second AC power in response to the switching signals SW. The second AC power may be supplied to the load 140 through the impedance matching circuit 130. The impedance matching circuit 130 may provide matching for an impedance of the load 140.

The controller 125 may transmit the switching signals SW to the inverter 123. The controller 125 may control the switching signals SW such that the inverter 123 converts the DC power to the second AC power. The controller 125 may also control the switching signals SW to regulate the amount of power supplied from the inverter 123 to the load 140. For example, the controller 125 may control the switching signals SW such that the inverter 123 supplies power through powering and freewheeling periods according to an example embodiment. The powering and the freewheeling periods will be described below in more detail.

Figure 2:
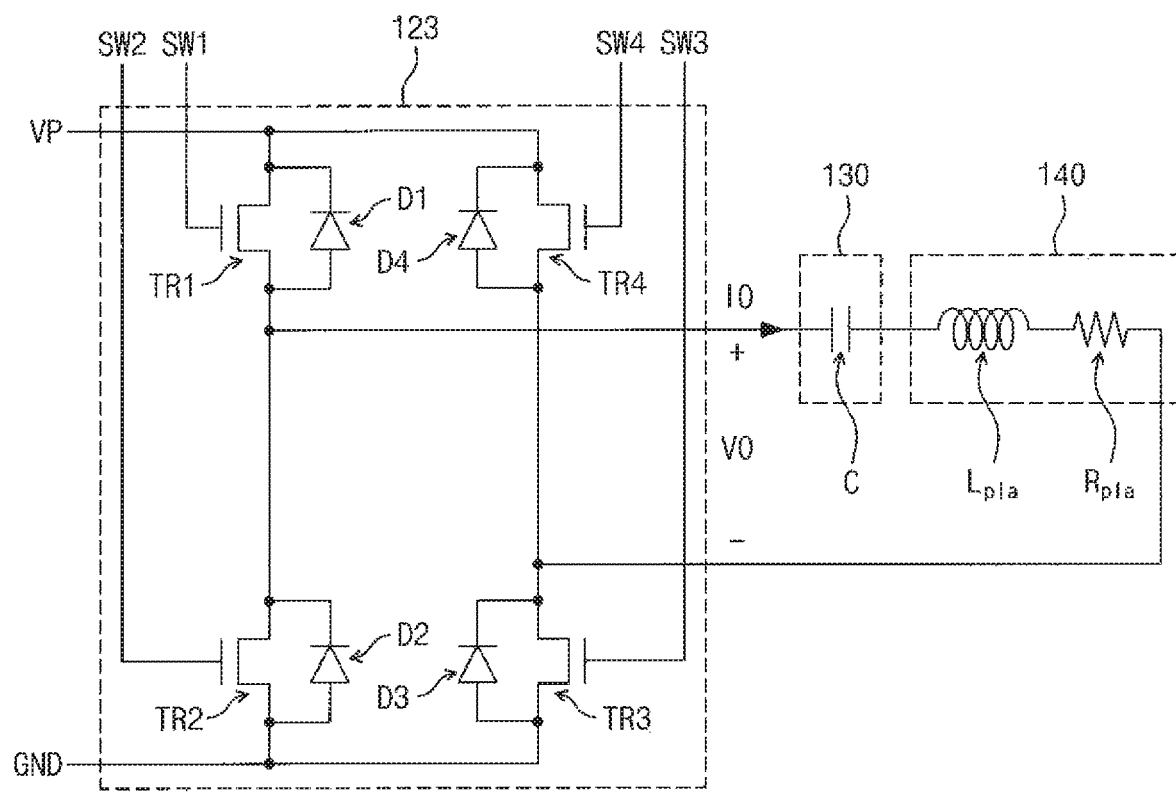
FIG. 2 is a detailed circuit diagram of an inverter, an impedance matching circuit, and a load according to an example embodiment of the present disclosure.

FIG. 2 is a detailed circuit diagram of an inverter 123, an impedance matching circuit 130, and a load 140 according to an example embodiment of the present disclosure. Referring to FIGS. 1 and 2, the inverter 123 may include first to fourth transistors TR1 to TR4 and first to fourth diodes D1 to D4.

The first and second transistors TR1 and TR2 may be coupled in series between a power supply node VP and a ground node GND. The first diode D1 may be connected in parallel to the first transistor TR1, and the second diode D2 may be connected in parallel to the second transistor TR2. The third and fourth transistors TR3 and TR4 may be coupled in series between the ground node GND and the power supply node VP. The third diode D3 may be connected in parallel to the third transistor TR3, and the fourth diode D4 may be connected in parallel to the fourth transistor TR4. As an example, the first to fourth diodes D1 to D4 may be body diodes or Schottky diodes.

First to fourth switching signals SW1 to SW4 may be transmitted to gates of the first to fourth transistors TR1 to TR4, respectively. That is, the first to fourth transistors TR1 to TR4 may operate in response to the first to fourth switching signals SW1 to SW4, respectively. The first to fourth switching signals SW1 to SW4 may correspond to the switching signals SW shown in FIG. 1.

A node between the first and second transistors TR1 and TR2 and a node between the third and fourth transistors TR3 and TR4 may be output nodes. The output nodes may transmit an output voltage VO to the impedance matching circuit 130 and the load 140. The output nodes may transmit an output current IO to the impedance matching circuit 130 and the load 140.

As an example, the impedance matching circuit 130 may include a capacitor C. However, an internal configuration of the impedance matching circuit 130 is not limited to a single capacitor. As an example, the load 140 may be an inductively coupled plasma (ICP) device. The load 140 may be modeled as an inductor Lpla and a resistor Rpla. The capacitor C, the inductor Lpla, and the resistor Rpla may be coupled in series between the output nodes of the inverter 123.

Figure 3:
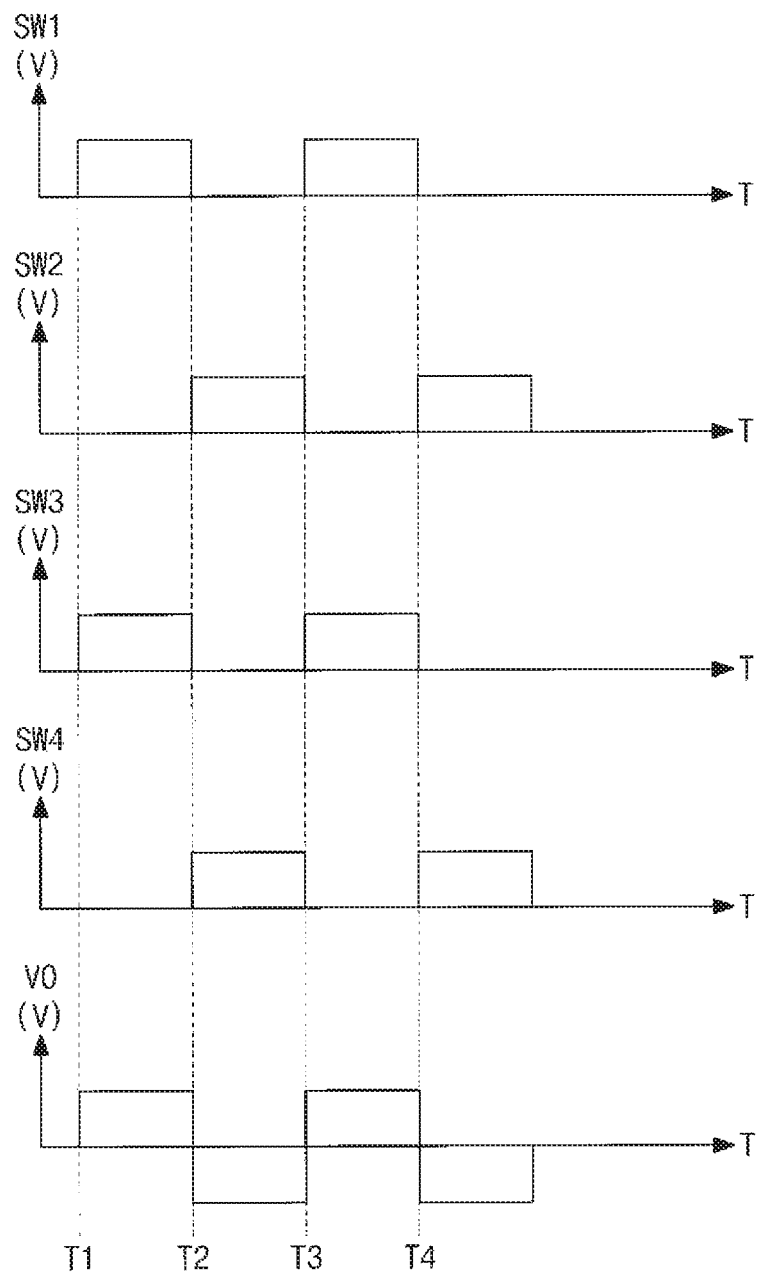
FIG. 3 illustrates an example in which a controller controls first to fourth switching signals.

FIG. 3 illustrates an example in which a controller 125 controls first to fourth switching signals SW1 to SW4.

In FIG. 3, horizontal axes indicate time T and vertical axes indicate first to fourth switching signals SW 1 to SW 4 and an output voltage. A unit of the vertical axes may be a voltage V. Referring to FIGS. 1 to 3, the first and third switching signals SW1 and SW3 are controlled in a single pair, and the second and fourth switching signals SW2 and SW4 may be controlled in a single pair When the first switching signal SW1 has a high level, the third switching signal SW3 may also have a high level. When the first switching signal SW1 has a low level, the third switching signal SW3 may also have a low level. Similarly, when the second switching signal SW2 has a high level, the fourth switching signal SW4 may also have a high level. When the second switching signal SW2 has a low level, the fourth switching signal SW4 may also have a low level.

The first and third switching signals SW1 and SW3 and the second and fourth switching signals SW2 and SW4 may be complementarily controlled. For example, when the first and third switching signals SW1 and SW3 have a high level, the second and fourth switching signals SW2 and SW4 may have a low level. When the first and third switching signals SW1 and SW3 have a low level, the second and fourth switching signals SW2 and SW4 may have a high level.

When a specific switching signal has a high level, a transistor to which the specific switching signal is transmitted may be turned on. When a specific switching signal has a low level, a transistor to which the specific switching signal is transmitted may be turned off.

When the first and third transistors TR1 and TR3 are turned on and the second and fourth transistors TR2 and TR4 are turned off, the first transistor TR1 may transmit a voltage at a power supply node VP and the third transistor TR3 may transmit a voltage at a ground node GND. Thus, the output voltage VO may have a positive value while the output current IO may have a positive value. That is, the output current IO may flow in a direction shown in FIG. 2.

When the first and third transistors TR1 and TR3 are turned off and the second and fourth transistors TR2 and TR4 are turned on, the second transistor TR2 may transmit a voltage at the ground node GND and the fourth transistor TR4 may transmit a voltage at the power supply node VP. Thus, the output voltage VO may have a negative value while the output current IO may have a negative value. That is, the output current may flow in a reverse direction of the direction shown in FIG. 2.

Figure 4:
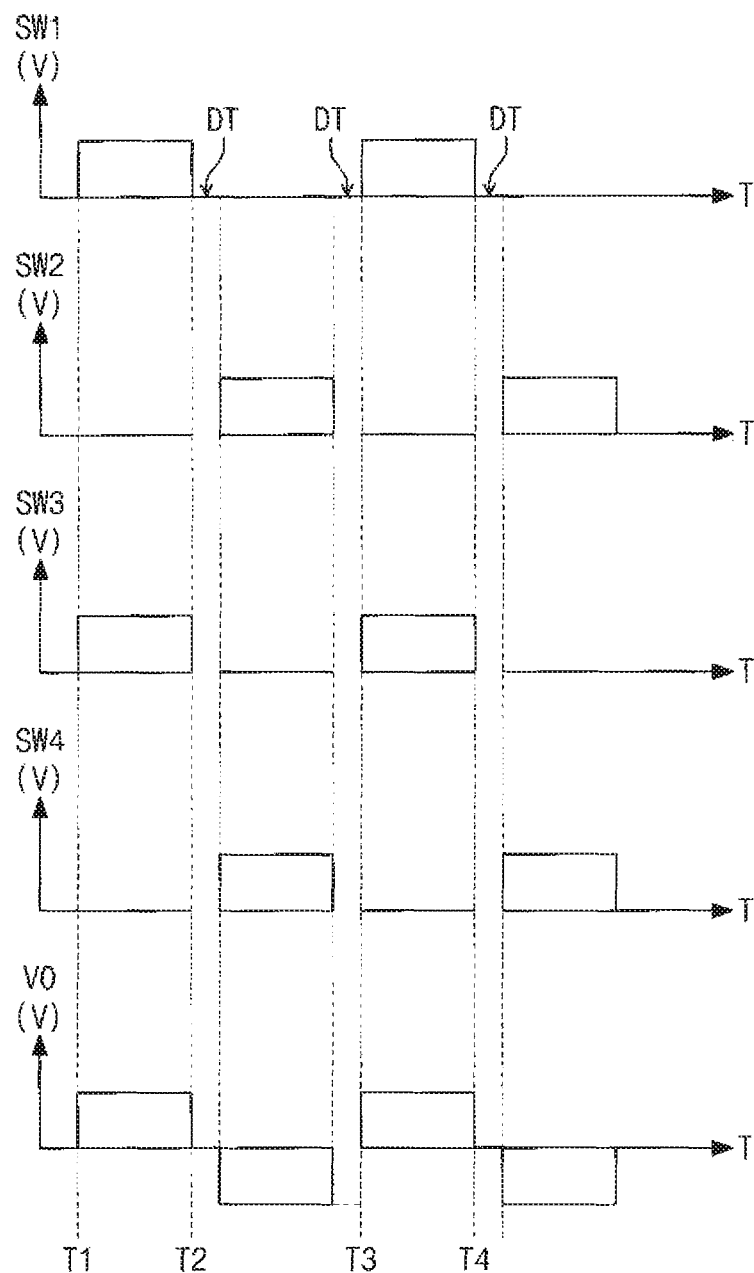
FIG. 4 illustrates an example in which dead time is added to first to fourth switching signals.

FIG. 4 illustrates an example in which dead time DT is added to first to fourth switching signals SW1 to SW4. In FIG. 4, horizontal axes indicate time T and vertical axes indicate first to fourth switching signals SW1 to SW4 and an output voltage VO. A unit of the vertical axes may be a voltage V.

As compared to FIG. 3, there is a dead time DT between a time point at which the first and third switching signals SW1 and SW3 transition from a high level to a low level and a time point at which the second and fourth switching signals SW2 and SW4 transition from a low level to a high level. Similarly, there is a dead time DT between a time point at which the first and third switching signals SW1 and SW3 transition from a low level to a high level and a time point at which the second and fourth switching signals SW2 and SW4 transition from a high level to a low level.

For the dead time DT, the first to fourth switching signals SW1 to SW4 all have low levels. That is, the first to fourth transistors TR1 to TR4 are turned off. The dead time DT may prevent the power supply node VP and the ground node GND from being short-circuited. For the dead time DT, the output voltage VO may have a level determined depending on a voltage and a current before the dead time DT and the operation timing of the first to fourth transistors TR1 to TR4.

Hereinafter, to avoid the complexity of description, first to fourth switching signals SW1 to SW4 and an output voltage VO will be shown while omitting dead time DT unless the dead time DT is necessary for explanation of the present inventive concepts. Even when the dead time DT is not explicitly shown or mentioned, it is not interpreted that the dead time DT is not intended to exist.

Figure 5:
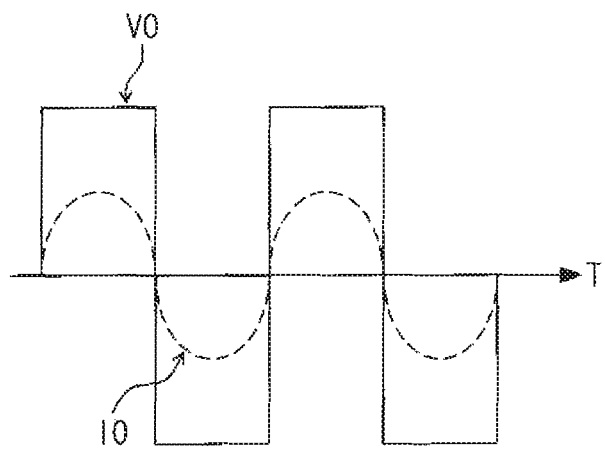
FIG. 5 illustrates an example of waveforms of an output voltage and an output current depending on lapse of time when a frequency of the output voltage and a resonant frequency of a load match each other.

FIG. 5 illustrates an example of waveforms of an output voltage VO and an output current IO depending on lapse of time T when a frequency fsw of the output voltage VO and a resonant frequency f0 of a load 140 match each other. Referring to FIGS. 1, 2, and 5, phases of the output voltage VO and the output current IO may match each other when the frequency fsw of the output voltage VO and the resonant frequency f0 of the load 140 match each other.

As an example, the resonant frequency f0 of the load 140 may be determined by an inductor Lpla of the load 140 and a capacitor C of the impedance matching circuit 130. The resonant frequency f0 of the load 140 may be determined by Equation (1).

$$f0 = \frac{1}{2\pi\sqrt{Lpla \cdot C}} \qquad \text{Equation (1)}$$

Figure 6:
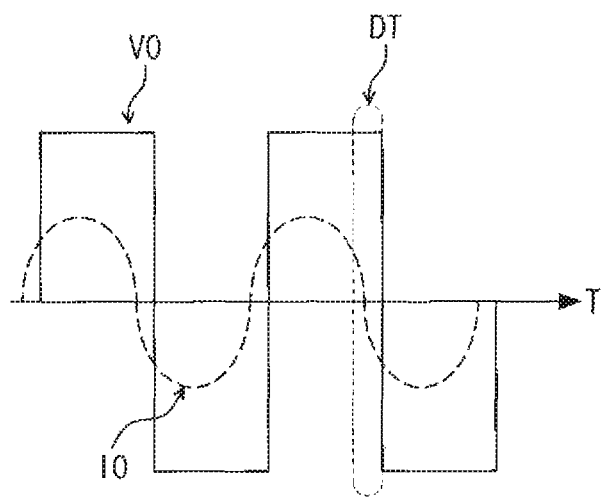
FIG. 6 illustrates an example of waveforms of an output voltage and an output current depending on lapse of time when a frequency of the output voltage is lower than a resonant frequency of a load.

FIG. 6 illustrates an example of waveforms of an output voltage VO and an output current IO depending on lapse of time T when a frequency fsw of the output voltage VO is lower than a resonant frequency f0 of a load 140. Referring to FIGS. 1, 2, and 6, a phase of the output voltage VO may lag behind a phase of the output current IO when the frequency fsw of the output voltage VO is lower than the resonant frequency f0 of a load 140.

Figure 7:
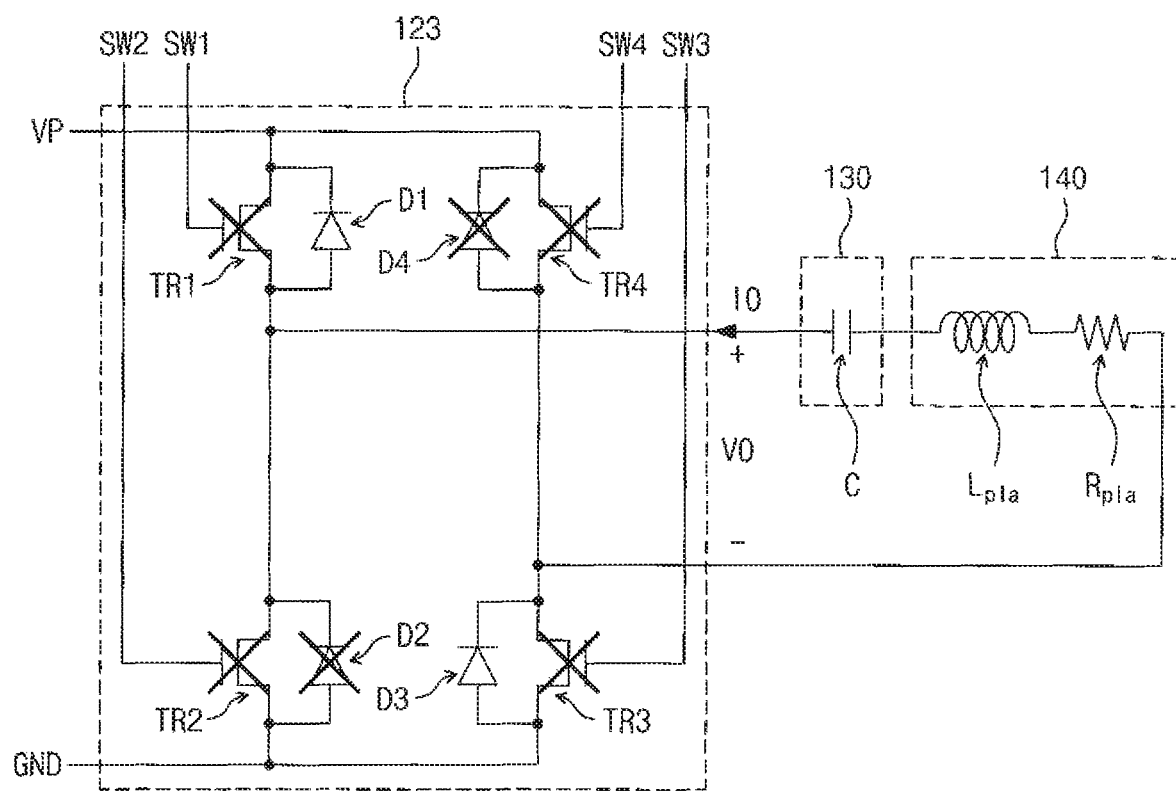
FIG. 7 illustrates an operating state of an inverter when an output voltage transitions from a high level to a low level according to the waveform of FIG. 6.

FIG. 7 illustrates an operating state of an inverter 123 when an output voltage VO transitions from a high level to a low level according to the waveform of FIG. 6. Referring to FIGS. 4, 6, and 7, there may be dead time DT when the output voltage VO transitions from a high level to a low level. For the dead time DT, the first to fourth transistors TR1 to TR4 may be turned off.

The output current IO flows to the inverter 123 from the load 140 and the impedance matching circuit 130. Due to a direction of the output current IO, the second and fourth diodes D2 and D4 do not pass the current, and the first and third diodes D1 and D3 pass the current. That is, when the phase of the output voltage VO lags behind the phase of the output current IO, the output current IO flows to the inverter 130 from the load 140 and the impedance matching circuit 130 for the dead time DT.

As the output current IO flows, power may unnecessarily consumed. Moreover, as the output current IO flows, the output voltage VO of the inverter 123 is maintained at a voltage difference between the power supply node VP and the ground node GND. The output voltage VO is applied to opposite ends of each of the second and fourth transistors TR2 and TR4.

When the dead time DT finishes, the second and fourth transistors TR2 and TR4 are turned on while a high voltage (for example, the output voltage VO) is applied to opposite ends of each of the second and fourth transistors TR2 and TR4, which may be an unnecessary stress applied to the second and fourth transistors TR2 and TR4 and may degrade the second and fourth transistors TR2 and TR4.

Since the first to fourth transistors TR1 to TR4 of the inverter 123 are symmetrically disposed, the same phenomenon may occur in the first and third transistors TR1 and TR3. For example, for the dead time DT when the output voltage VO transitions from a low level to a high level, power may be unnecessarily consumed and a stress may generated in the first and third transistors TR1 and TR3.

Figure 8:
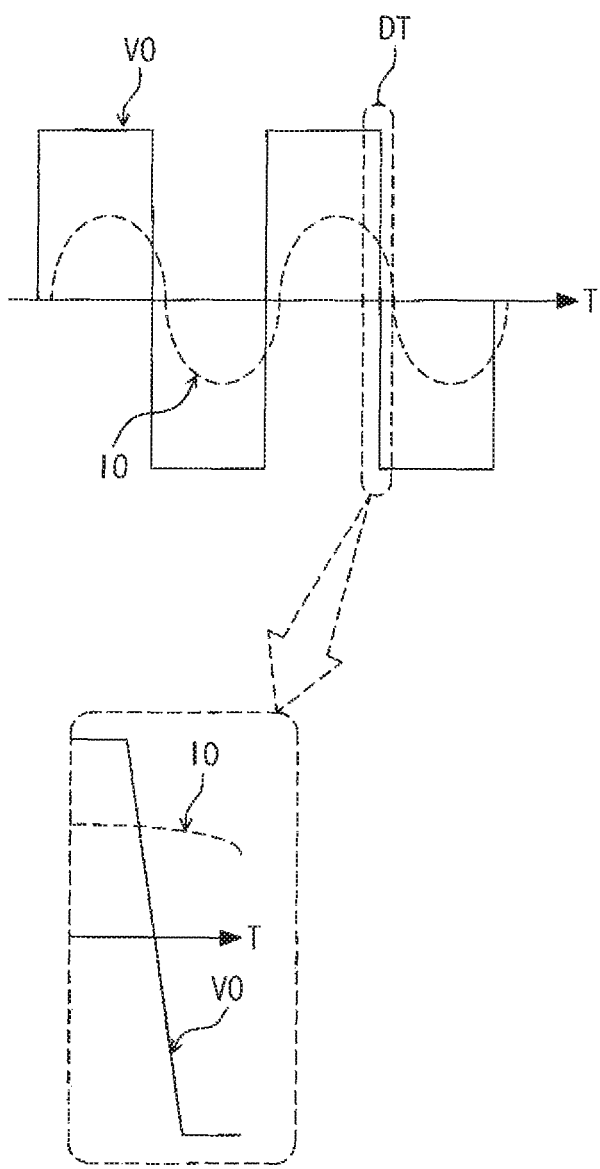
FIG. 8 illustrates an example of waveforms of an output voltage and an output current depending on lapse of time when a frequency of the output voltage is higher than a resonant frequency of a load match each other.

FIG. 8 illustrates an example of waveforms of an output voltage VO and an output current IO depending on lapse of time T when a frequency fsw of the output voltage VO is higher than a resonant frequency f0 of a load 140 match each other. Referring to FIGS. 1, 2, and 8, a phase of the output voltage VO may lead a phase of the output current IO when the frequency fsw of the output voltage VO is higher than the resonant frequency f0 of the load 140.

Figure 9:
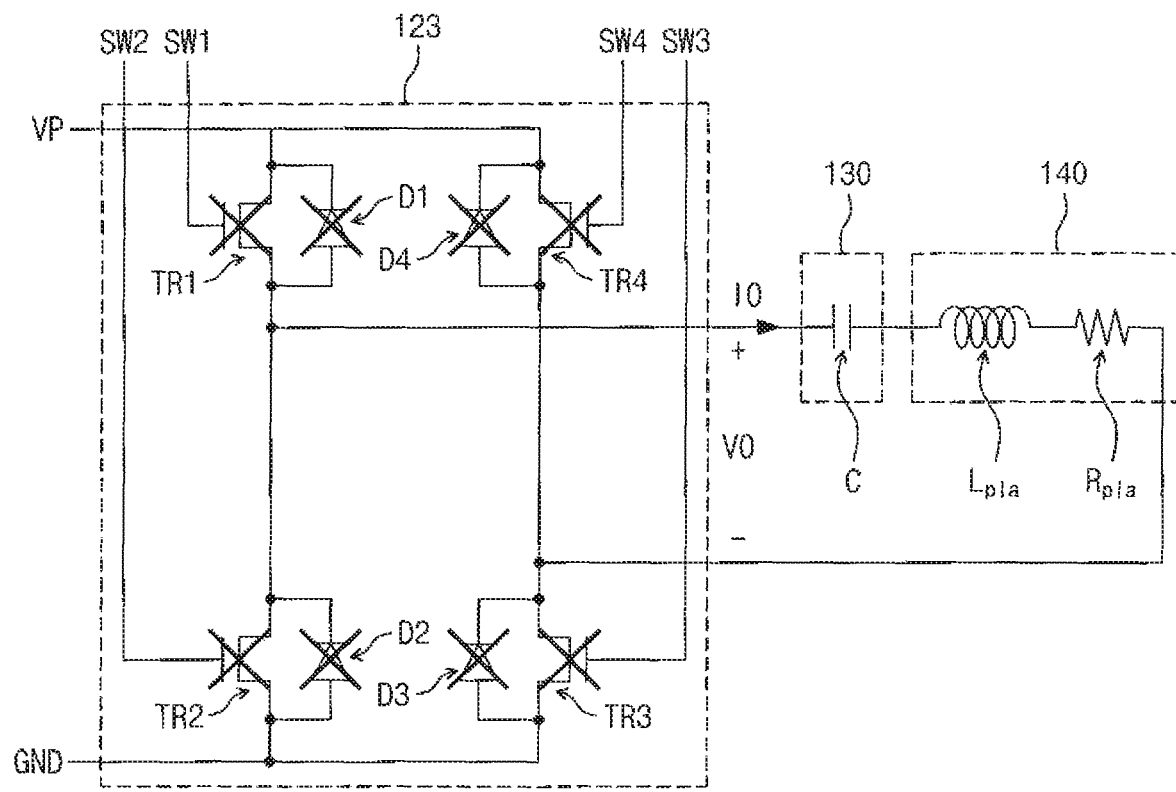
FIG. 9 illustrates an operating state of an inverter when an output voltage transitions from a high level to a low level according to the waveform of FIG. 8.

FIG. 9 illustrates an operating state of the inverter 123 when an output voltage VO transitions from a high level to a low level according to the waveform of FIG. 8. Referring to FIGS. 4, 8 and 9, there may be dead time DT when the output voltage VO transitions from a high level to a low level. For the dead time DT, the first to fourth transistors TR1 to TR4 may be turned off.

Since the output current IO has a positive value, the output current IO flows from the inverter 123 to the impedance matching circuit 130 and the load 140. A direction of the output current IO may prevent the output current IO from flowing through the first to fourth diodes D1 to D4. Instead, the output current IO may flow through parasitic capacitors (not shown) of the first and third transistors TR1 and TR3.

As the output current IO flows, opposite end voltages of each of the first and third transistors TR1 and TR3 may increase by a voltage difference between the power supply node VP and the ground node GND. Resonance (for example, parasitic resonance) may occur due to the parasitic capacitors (not shown) of the first and third transistors TR1 and TR3 and parasitic inductors (not shown) of wirings when the output current IO flows. The parasitic resonance increases as the intensity of the output current IO increases, and may high-frequency switching noise.

While the output current flows through the first and third transistors TR1 and TR3, the first and third transistors TR1 and TR3 are turned off at the dead time DT, which may act as a stress on the first and third transistors TR1 and TR3. Since the first to fourth transistors TR1 to TR4 are symmetrically disposed, the same high-frequency switching noise and stress may be generated in the second and fourth transistors TR2 and TR4 when the output voltage VO transitions from the low level to the high level.

As described above, when the frequency fsw of the output voltage VO is different from the resonant frequency f0 of the load 140, a stress may be applied to the first to fourth transistors TR1 to TR4 or power may be unnecessarily consumed. Thus, the frequency fsw of the output voltage VO should be controlled similarly to the resonant frequency f0 of the load 140 to improve reliability and performance of the power supply 120.

In detail, the frequency fsw of the output voltage VO is slightly higher (for example, about 0.1 to 10 percent) than the resonance frequency f0 of the load 140. When the frequency fsw of the output voltage VO is slightly higher than the resonance frequency f0 of the load 140, the instantaneous intensity of the output current IO have a fine positive value (for example, 0.1 percent to 10 percent of a maximum) in the state of the dead time DT of FIG. 8.

In the situation described with reference to FIGS. 8 and 9, the first and third transistors TR1 and TR3 are turned off while a minute current flows. Therefore, the stress applied to the first and third transistors TR1 and TR3 is negligible. For the dead time DT, as the output current IO flows, the opposite end voltages of each of the first and third transistors TR1 and TR3 increase by a voltage difference between the power supply node VP and the ground node GND.

For the dead time DT, opposite end voltages of each of the second and fourth transistors TR2 and TR4 decrease to 0 volt (or a similar low volt) as the output current IO flows. That is, when the dead time DT finishes and the second and fourth transistors TR2 and TR4 are turned on, the opposite end voltages of each of the second and fourth transistors TR2 and TR4 are 0 volt. Therefore, the second and fourth transistors TR2 and TR4 are negligible.

Likewise, when the phase of the output voltage VO is controlled to minutely lead the phase of the output current IO (for example, 0.1% to 10%), transistors may perform a preferable switching operation called zero voltage nearly zero current switching (ZVZCS). According to the ZVZCS, the first to fourth transistors TR1 to TR4 of the inverter 123 may be stably controlled. The controller 125 may control the first to fourth switching signals SW1 to SW4 according to the ZVZCS.

Figure 10:
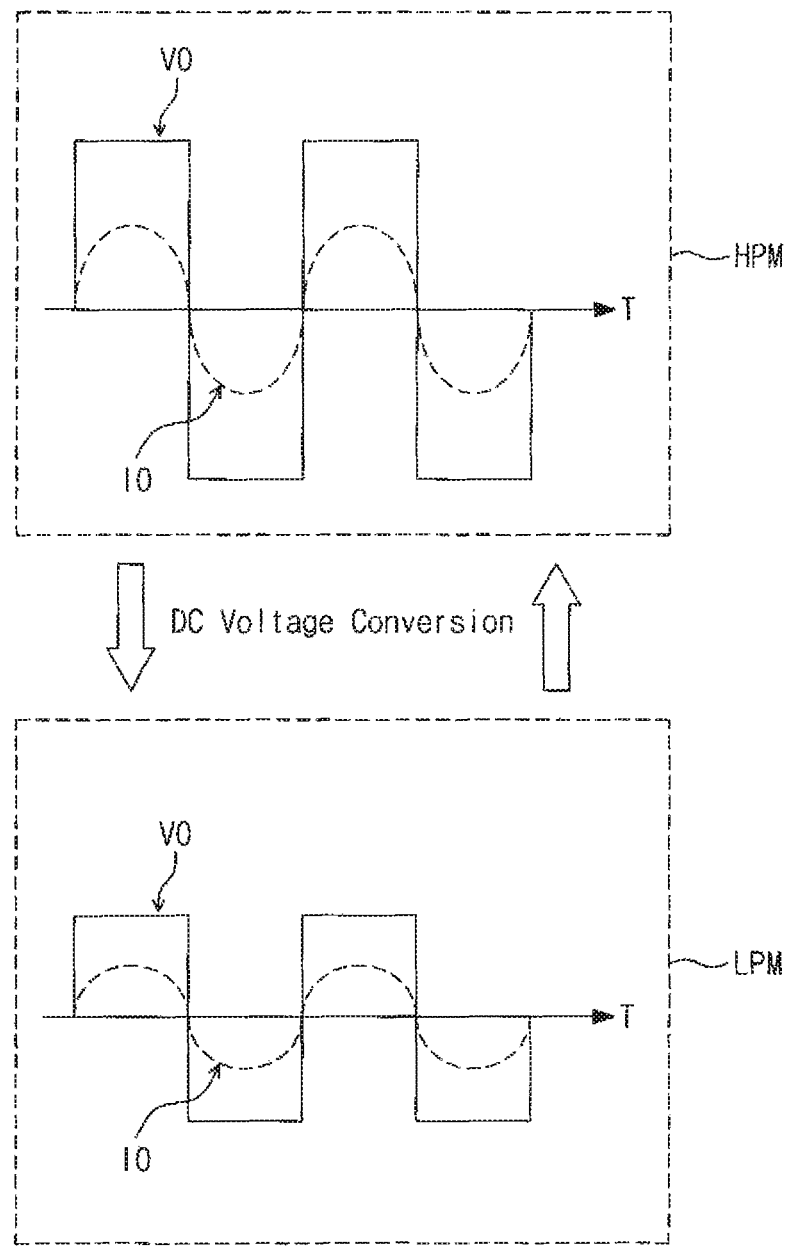
FIG. 10 illustrates an example of a method of controlling power depending on DC voltage conversion.

Power supplied to the load 140, for example, the amount of power may be controlled to precisely control the operation of the load 140. Various methods may be used to control the power supplied to the load 140. FIG. 10 illustrates an example of a method of controlling power depending on DC voltage conversion. Referring to FIG. 10, a maximum value of the output voltage VO may be adjusted according to the DC voltage conversion.

When DC voltage conversion is used, phases of an output voltage VO and an output current IO are maintained in an unchanged state. Thus, an advantage that the operation of the inverter 123 is stable is provided. Meanwhile, when the DC voltage conversion is used, a separate DC-DC converter is required to perform DC voltage conversion of a power supply node VP. Additionally, there are disadvantages in that a time is required to perform DC-DC conversion and power control speed is slow.

Figure 11:
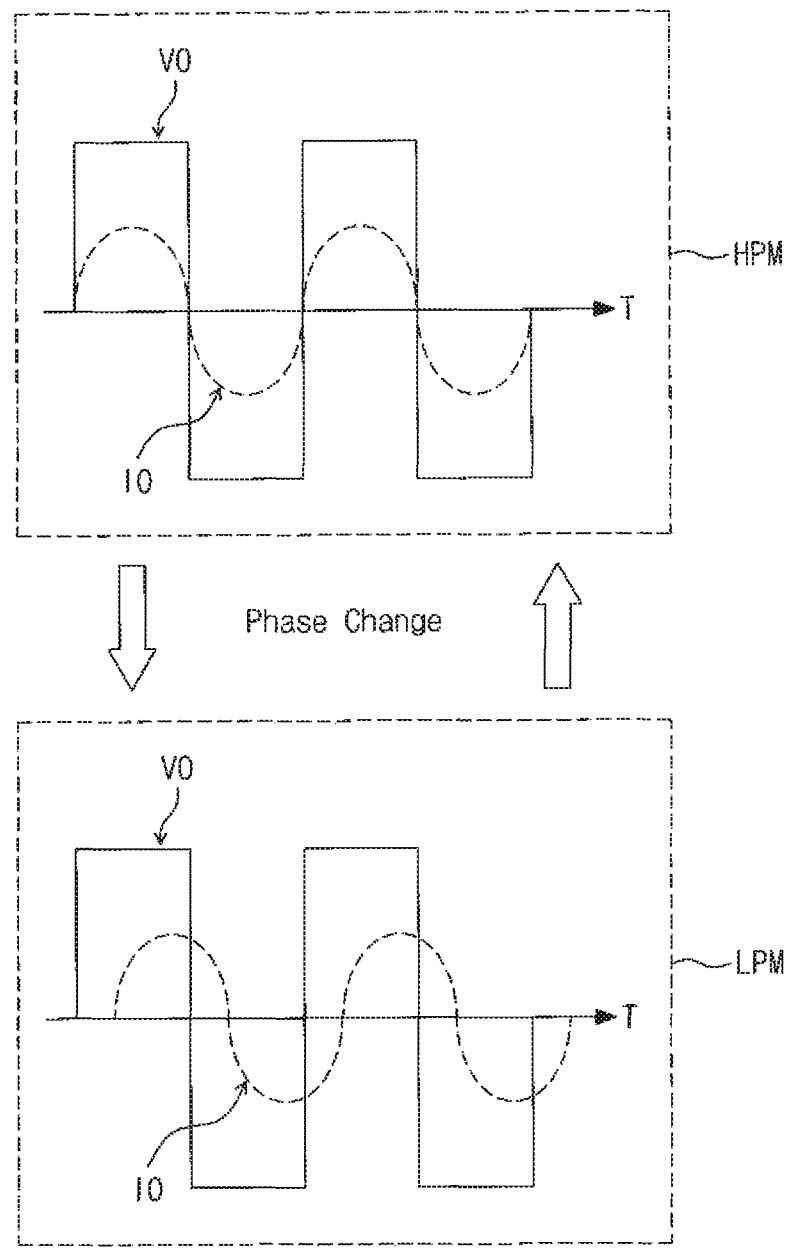
FIG. 11 illustrates an example of a method of controlling power depending on phase change.

FIG. 11 illustrates an example of a method of controlling power depending on phase change. Referring to FIG. 11, a difference in phase between an output voltage VO and an output current IO may be adjusted according to phase conversion. When an area of an overlapping region is decreased by the difference in phase between the output voltage VO and the output current IO, power supplied to the load 140 is decreased. Accordingly, the power supplied to the load 140 may be adjusted by adjusting a frequency fsw of the output voltage VO.

Since the power is adjusted by adjusting the frequency fsw of the output voltage VO, the power may be adjusted relatively rapidly. However, when the phases of the output voltage VO and the output current IO are different, a stress may be applied to the first to fourth transistors TR1 to TR4, as described with reference to FIGS. 5 to 9. Thus, stability of the inverter 123 may be degraded.

Figure 12:
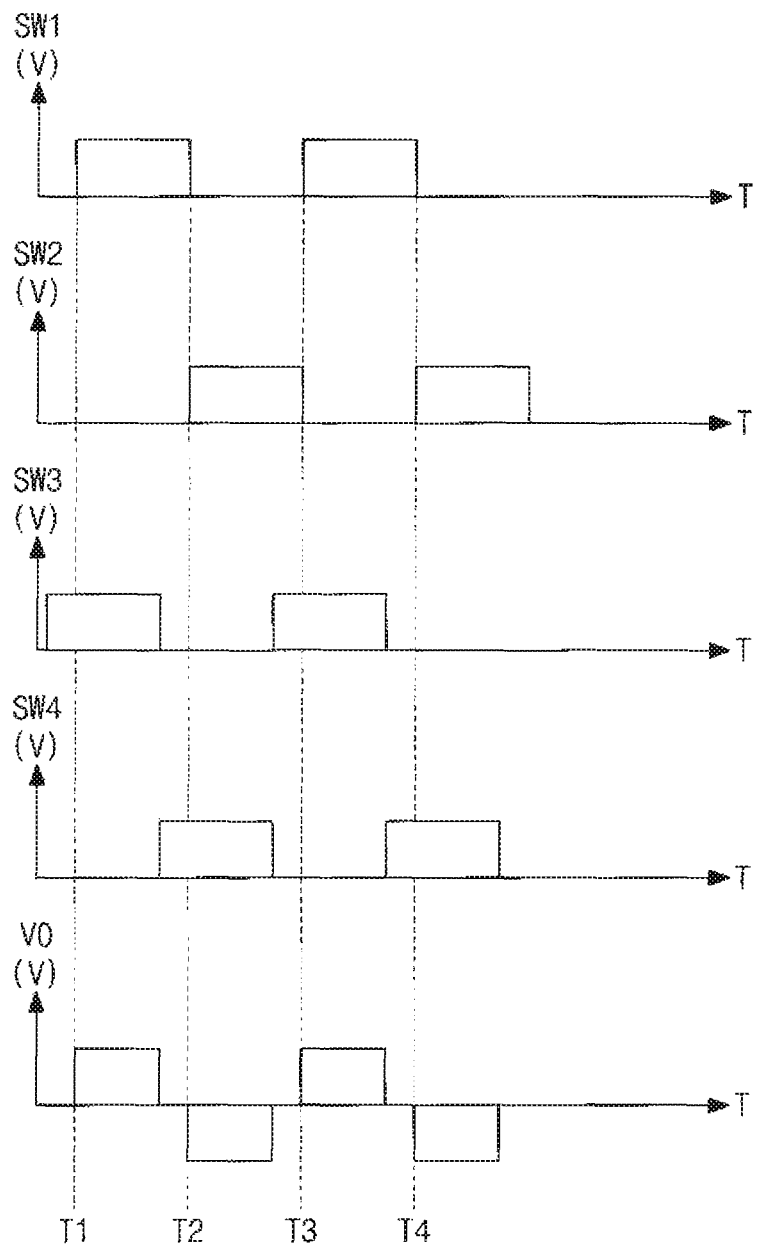
FIG. 12 illustrates an example in which first to fourth switching signals and an output voltage are adjusted depending on pulse width modulation.

FIG. 12 illustrates an example in which first to fourth switching signals SW1 to SW4 and an output voltage VO are adjusted depending on pulse width modulation. Referring to FIGS. 2 and 12, first and second switching signals SW1 and SW2 may have the same phases as phases described with reference to FIG. 3. Third and fourth switching signals SW3 and SW4 may have phases leading phases described with reference to FIG. 3.

The output voltage VO has a high level when the first and third switching signals SW1 and SW3 together have a high level. When the phase of the third switching signal SW3 leads the phase of the first switching signal SW1, a period in which the first and third switching signals SW1 and SW3 have a high level together is reduced. Thus, a period in which the output voltage VO has the high level is reduced.

The output voltage VO has a low level when the second and fourth switching signals SW2 and SW4 together have a high level. When the phase of the fourth switching signal SW4 leads the phase of the second switching signal SW2, a period in which the second and fourth switching signals SW2 and SW4 have a high level together is reduced. Thus, a period in which the output voltage VO is low is reduced.

Figure 13:
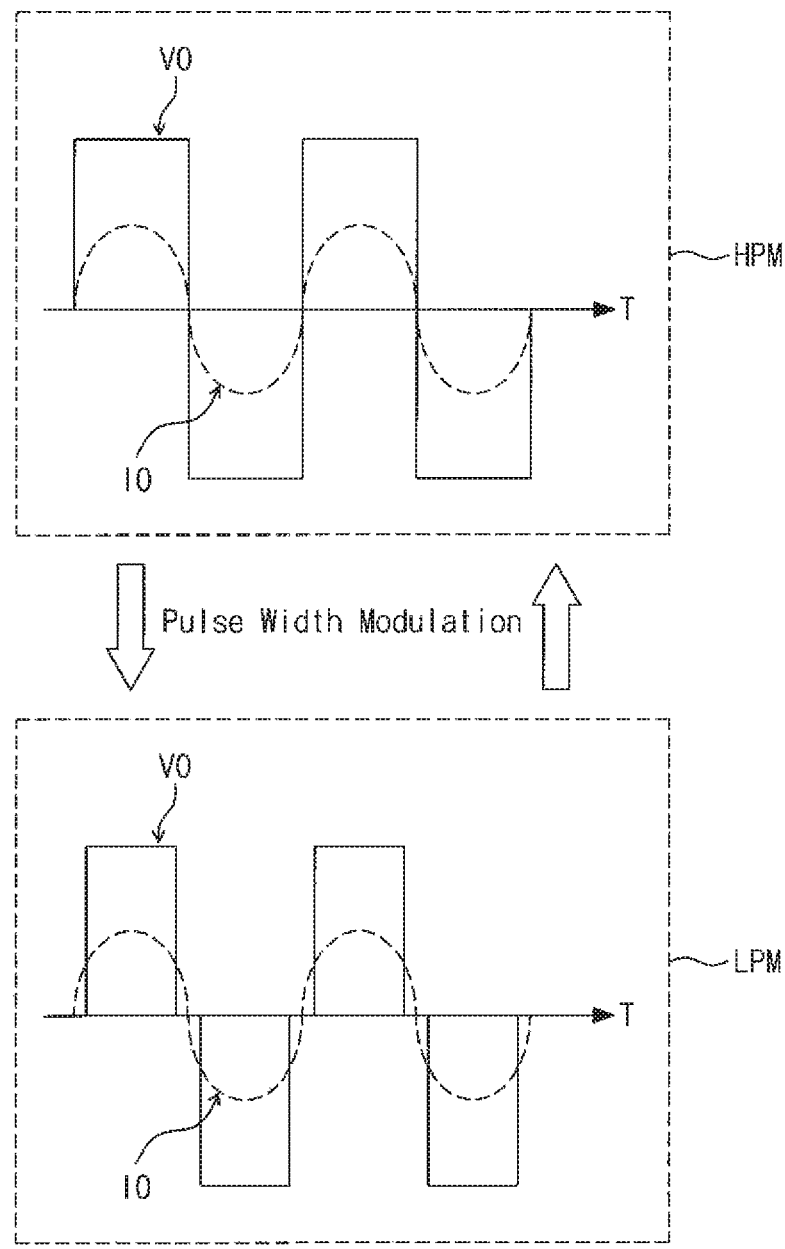
FIG. 13 illustrates an example of a method of controlling power depending on pulse width modulation.

FIG. 13 illustrates an example of a method of controlling power depending on pulse width modulation. Referring to FIG. 13, a pulse width of an output voltage VO may be adjusted by pulse width modulation. When an overlapping region between the output voltage VO and the output current IO is reduced, power supplied to the load 140 is reduced. Thus, the power supplied to the load 140 may be adjusted by modulating the pulse width of the output voltage VO.

However, in a case in which the pulse width of the output voltage VO is reduced, some of the first to fourth transistors TR1 to TR4 may be switched when the output current IO has a positive value or a negative value. Accordingly, a stress may be applied to the first to fourth transistors TR1 to TR4 and stability of the inverter 123 may be reduced.

Figure 14:
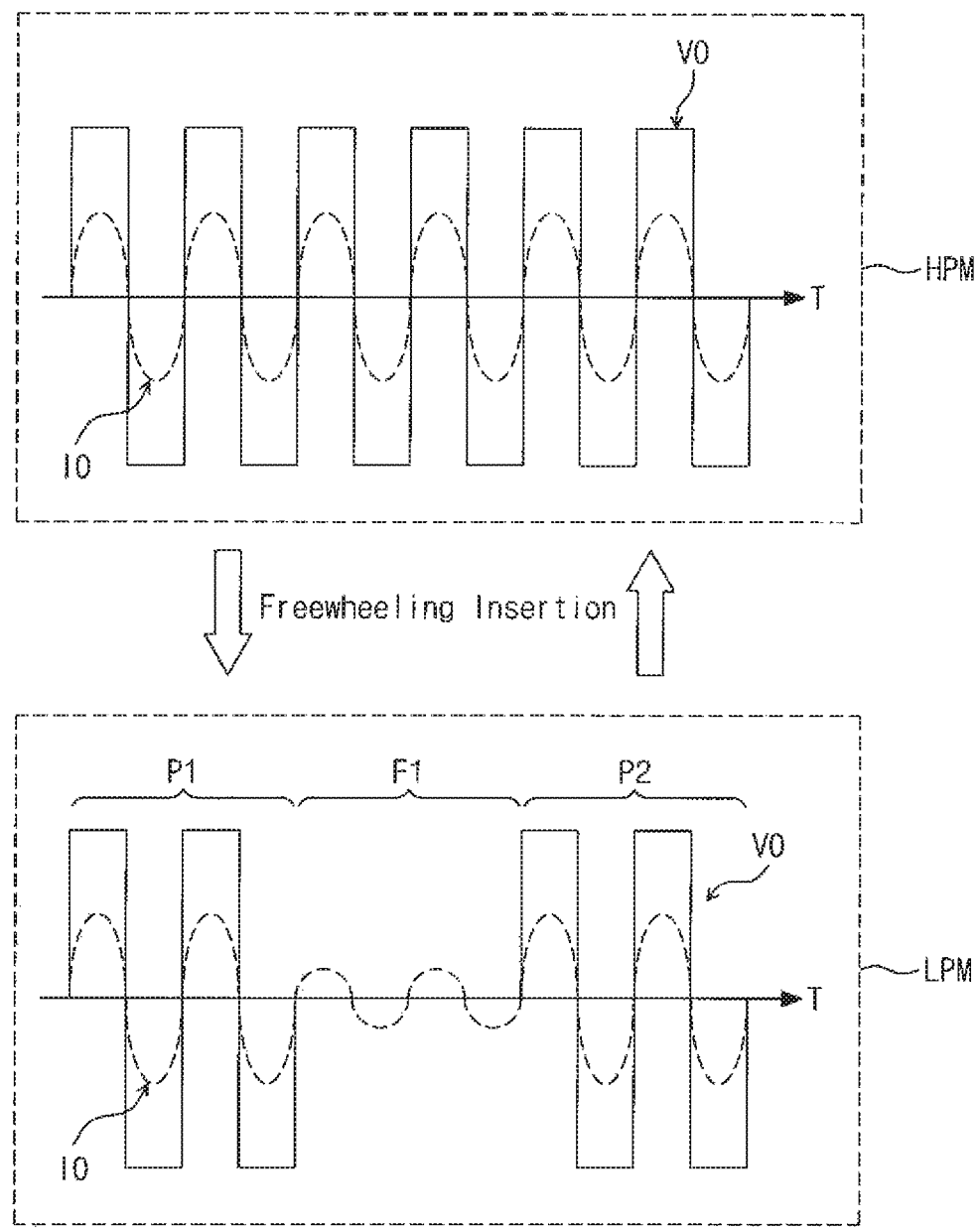
FIG. 14 illustrates a method of supplying power according to an example embodiment of the present disclosure.

FIG. 14 illustrates a method of supplying power according to an example embodiment of the present disclosure. Referring to FIGS. 1, 2 and 14, the controller 125 may adjust power (for example, the amount of power) supplied to the load 140 through freewheeling insertion. As an example, six cycles of the output voltage VO are shown in FIG. 14. To describe the present inventive concept, it will be assumed that six cycles are a unit time. However, the unit time for adjusting the amount of power is not limited to the six periods of the output voltage VO.

In a high power mode (HPM), the controller 125 may control the first to fourth switching signals SW1 to SW4 using the method described with reference to FIG. 3 or FIG. 4. The output voltage VO may continuously transition, and the output current IO may also continuously transition. In a low power mode (LPM), the controller 125 may control the first to fourth switching signals SW1 to SW4 according to a powering period and a freewheeling period.

The powering period may include first and second powering periods P1 and P2. In the first and second powering periods P1 and P2, the controller 125 may control the first to fourth switching signals SW1 to SW4 using the method described with reference to FIG. 3 or 4. The freewheeling period may include a first freewheeling period F1. During the first freewheeling period F1, the controller 125 may control the first to fourth switching signals SW1 to SW4 in such a manner that the output voltage VO does not have a high level and a low level (for example, has a ground level).

For example, during the first freewheeling period F1, the controller 125 may maintain the first through fourth switching signals SW1 to SW4 at low levels. Since the output voltage VO is not supplied, the amount of the output current IO during the first freewheeling period F1 may be smaller than the amount of the output current IO during the first and second powering periods P1 and P2. The inverter 123 supplies power to the load 140 during the first and second powering periods P1 and P2, but does not supply power to the load 140 during the first freewheeling period F1.

The controller 125 may adjust an entire length of the powering period and an entire length of the freewheeling period for a unit time to control the amount of power supplied to the load 140 for the unit time. The longer the freewheeling period, the smaller the amount of power supplied to the load 140. The shorter freewheeling period, the greater the amount of power supplied to the load 140. As an example, the power amount P may be calculated by Equation (2).

$$P = \left(\frac{1}{\sqrt{2}} \times \frac{4}{\pi} \times VVP \times \frac{(N-n)}{N}\right)^2 \times \frac{1}{Rpla} \qquad \text{Equation (2)}$$

In Equation (2), VVP denotes a voltage at the power supply node VP, N denotes the number of all periods included in the unit time, and n denotes the number of all freewheeling periods included in the unit time. As an example, when the freewheeling period is adjusted in units of half cycle, N and n may be changed to the number of half cycles. As shown in Equation (2), the power amount P may be adjusted depending on a length of the powering period, that is, a length of the freewheeling period.

As an example, the freewheeling period may be distinguished from a dead time DT (see FIG. 4) in that the freewheeling period has a length longer than or equal to a half cycle of the output voltage VO. The dead time DT may be shorter than the half cycle of the output voltage VO. When the dead time DT has a length corresponding to the half cycle of the output voltage VO, the phases of the output voltage VO and the output current IO are changed in each cycle. Thus, the power supply 120 does not operate normally.

Figure 15:
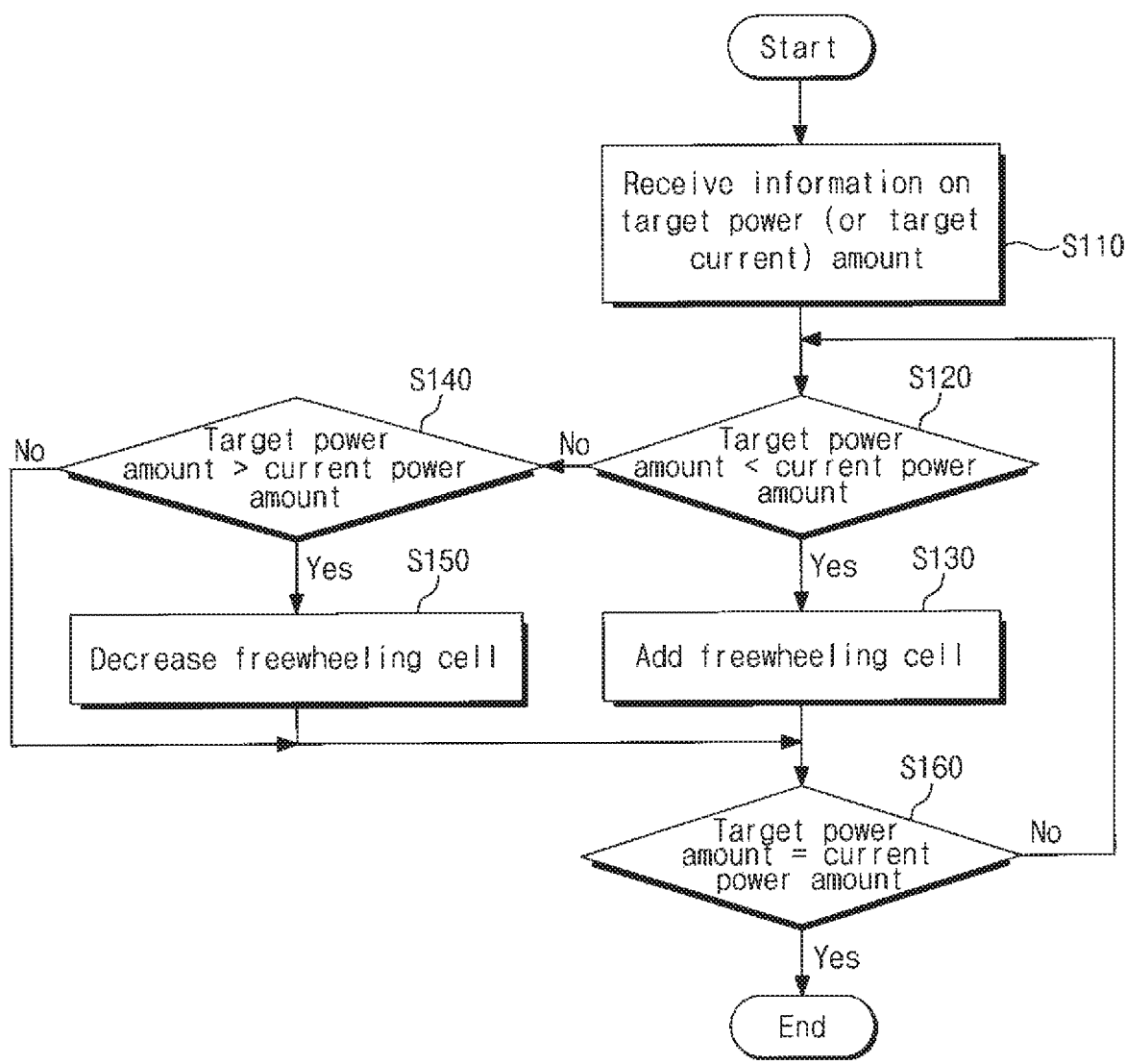
FIG. 15 is a flowchart illustrating an example of a method of controlling power according to an example embodiment of the present disclosure.

FIG. 15 is a flowchart illustrating an example of a method of controlling power according to an example embodiment of the present disclosure. Referring to FIGS. 1, 2, and 15, in operation S110, the controller 125 may receive information on a target power amount (or a target current amount). For example, the controller 125 may receive a target power amount (or a target current amount) through communication with an external device or through a user terminal receiving information from a user.

In operation S120, the controller 125 determines whether the target power amount is less than a current power amount. When the target power amount is less than the current power amount, the controller 125 may add a freewheeling cell in operation S130. For example, the freewheeling cell may be used to increase a length of the freewheeling period and may include a freewheeling period corresponding to at least one half cycle. The powering period having the corresponding length for the unit time may decrease by the added freewheeling cell. Then, the controller 125 may perform operation S160.

When the target power amount is not less than the current power amount, the controller 125 may determine whether the target power amount is greater than the current power amount in operation S140. When the target power amount is greater than the current power amount, the controller 125 may decrease the freewheeling cell in operation S150. For example, the controller 125 decrease a single freewheeling cell for a unit time and the powering period having the corresponding length may be increased. Then, the controller 125 may perform operation S160.

In operation S160, the controller 125 determines whether the target power amount is equal to the current power amount. When the target power amount is not equal to the current power amount, the controller 125 may perform operation S120. When the target power amount is equal to the current power amount, the controller 125 may terminate the power control. As an example, in the case of the power supply system 100 in which the current power amount varies depending on an environmental change, the controller 125 may return to operation S110 to continue to perform power supply monitoring, instead of termination of power adjustment.

Figure 16:
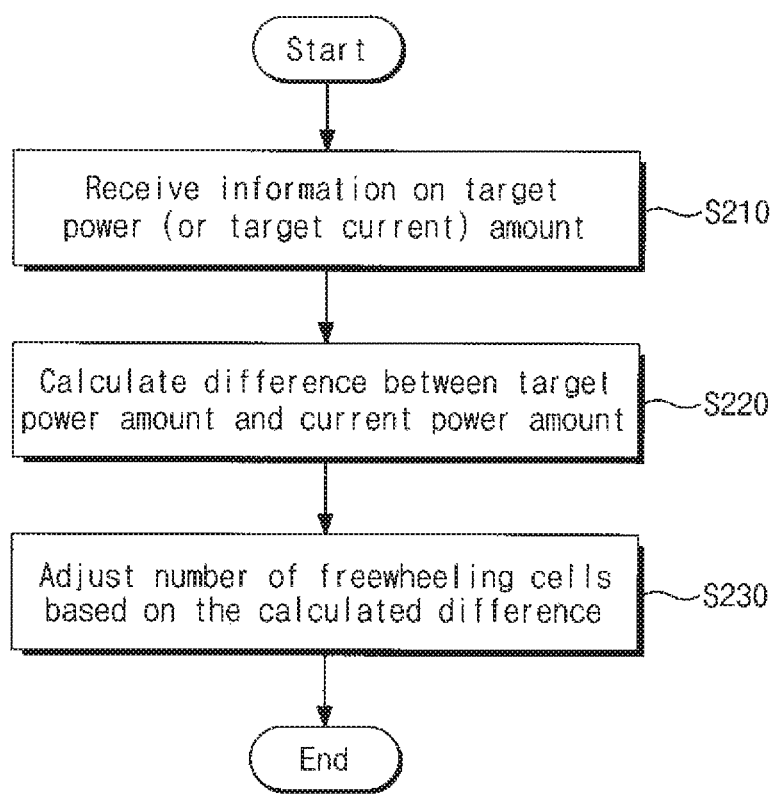
FIG. 16 illustrates an example of a method of supplying power according to an application embodiment of the present disclosure.

FIG. 16 illustrates an example of a method of supplying power according to an application embodiment of the present disclosure. Referring to FIGS. 1, 2, and 16, in operation S210, the controller 125 may receive information on target power amount (or target current amount). In operation S220, the controller 125 may calculate a difference between the target power amount and the current power amount. In operation S230, the controller 125 may adjust the number of freewheeling cells based on the calculated difference.

As an example, the controller 125 may store a look-up table indicating the number of freewheeling cells to increase or decrease depending on a difference in the amount of power. The controller 125 may adjust the number of freewheeling cells with reference to the lookup table. As another example, the controller 125 may include an operator configured to operate a function that calculates the number of freewheeling cells to increase or decrease depending on a difference in the amount of power. The controller 125 may adjust the number of freewheeling cells using an operator.

Figure 17:
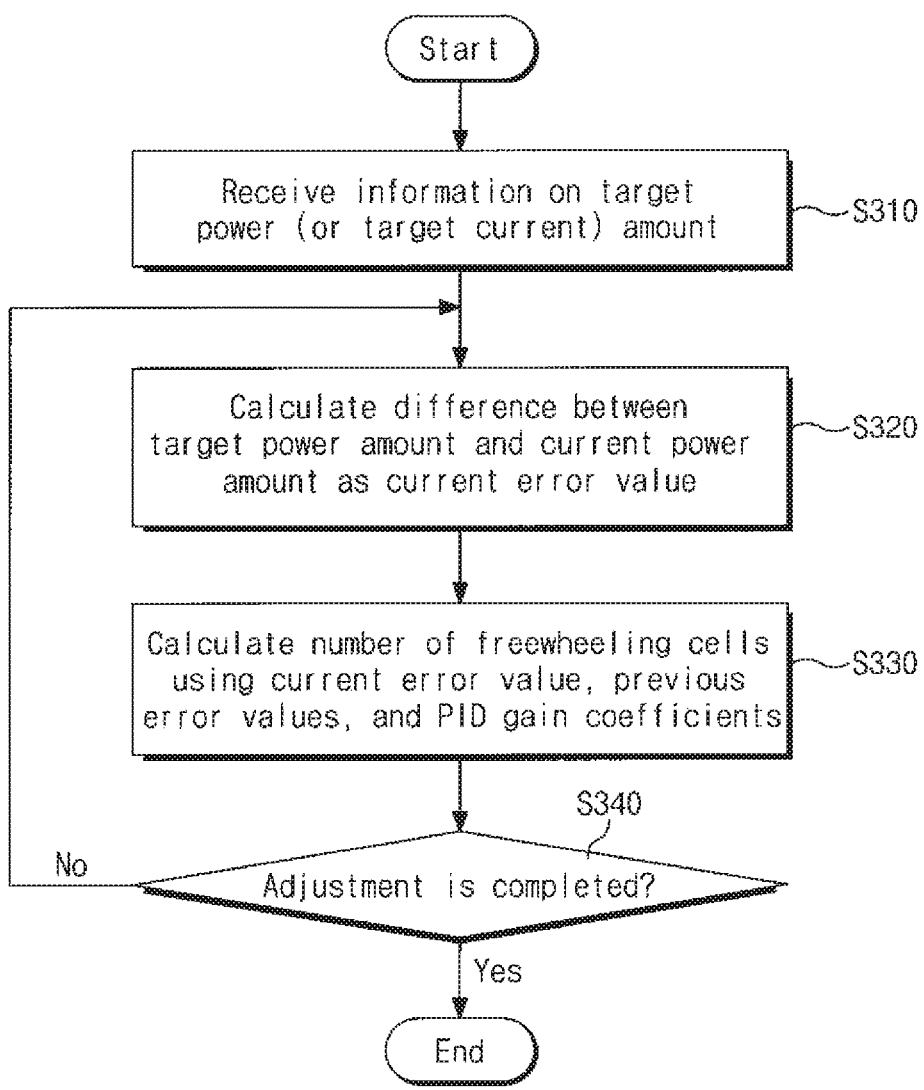
FIG. 17 illustrates another example of a method of supplying power according to an application embodiment of the present disclosure.

FIG. 17 illustrates another example of a method of supplying power according to an application embodiment of the present disclosure. Referring to FIGS. 1, 2, and 17, in operation S310, the controller 125 may receive information of target power amount (or target current amount). In operation S320, the controller 125 may calculate a difference between the target power amount and current power amount as an error value.

In operation S330, the controller 125 determines whether a current error value (for example, an error value calculated in operation S320 of a current loop), previous error values (for example, error values calculated in one or more previous loops), and PID proportional-integral-derivation (PID) gain factors. As an example, the number of freewheeling cells may be calculated by Equation (3).

$$n[k]=n[k-1]+(Kp+Ki+Kd)e[k]+(-Kp-2Kd)e[k-1]+ Kd \cdot e[k-2] \qquad \text{Equation (3)}$$

In Equation (3), n[k] denotes the number of cycles of powering period included in a current loop, that is, a current unit time, n[k−1] denotes the number of cycles of a powering period included in just a previous loop, that is, a previous unit time, e[k] denotes an error value calculated in a current loop, that is, a current unit time, e[k−1] denotes an error value calculated in a first previous loop, i.e., a first previous unit time, e[k−2] denotes an error value calculated in a second previous loop, that is, a second previous unit time, and Kp, Ki, and Kd denote PID gain factors.

In operation S340, the controller 125 determines whether the adjustment is completed. For example, the controller 125 may determine whether an error value of a current loop falls within a predetermined range. When the error value of the current loop falls within the predetermined range, the controller 125 may finish adjusting the amount of power. When the error value of the current loop does not fall within the predetermined range, the controller 125 may perform the next loop. As an example, a single loop may include operations S320 and S330.

As described above, according to an example embodiment, a length of the freewheeling interval (or powering interval) included in the unit time may be adjusted to control the amount of power supplied to the load 140. Since freewheeling insertion is performed by adjusting the timing at which the first to fourth switches SW1 and SW4 have a high level, a separate complex device is not required, and the freewheeling insertion may be easily performed while maintaining a difference in phase between the output voltage VO and the the output current IO.

Figure 18:
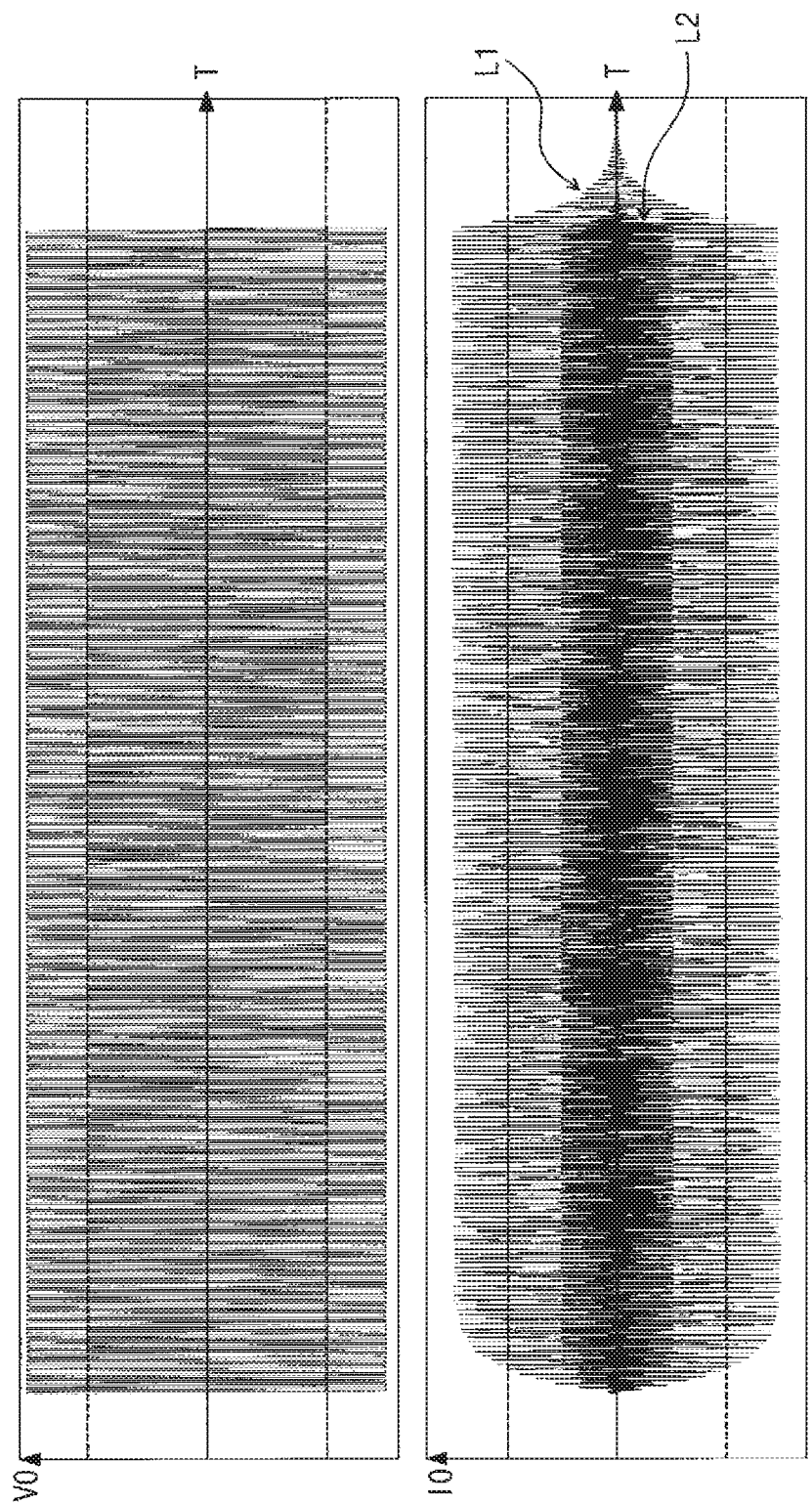
FIG. 18 illustrates examples in which power is consumed according to quality factors.

Referring again to FIG. 14, power is not supplied to the load 140 during a first freewheeling period F1. When the first freewheeling period F1 is excessively prolonged, the power supplied to the load 140 may be entirely consumed and the load 140 may be turned off. FIG. 18 illustrates examples in which power is consumed according to quality factors. In FIG. 18, horizontal axes denote time T and vertical axes denote an output voltage VO and an output current IO.

Referring to FIGS. 1, 2, and 18, a first line L1 indicates an output current IO when the quality factor Q is 15 and a second line L2 indicates an output current IO when the quality factor Q is 5. The quality factor Q may be determined by a capacitor C of the impedance matching circuit 130, resistance Rpla of the load 140, and an inductor Lpla. The quality factor (Q) may be calculated by Equation (4).

$$Q = \frac{\sqrt{Lpla/C}}{Rpla} \qquad \text{Equation (4)}$$

At the first time T1, the inverter 123 enters a freewheeling period under the control of the controller 125. As the power output by the inverter 125 is cut off, an amount of the current supplied to the load 140 begins to be decreased. When the power charged in the impedance matching circuit 130 and the load 140 is entirely consumed, the output current IO does not flow any longer. As shown by the first line L1 and the second line L2, the output current IO is cut off more rapidly when the quality factor Q is low. That is, the charged power is consumed more rapidly.

Figure 19:
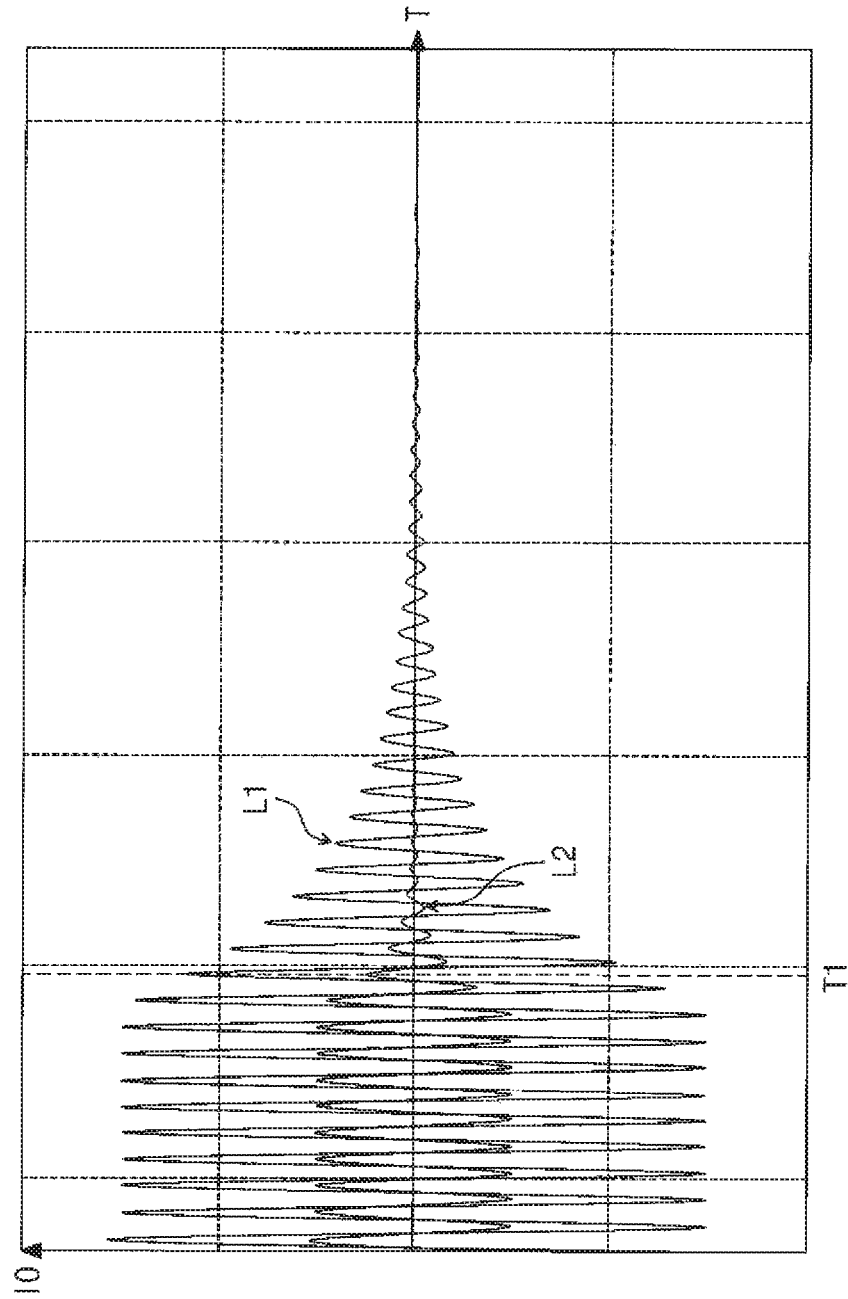
FIG. 19 illustrates first and second lines after and before first time in more detail.

FIG. 19 illustrates the first and second lines L1 and L2 after and before the first time T1 in more detail. Referring to FIGS. 1, 2, and 19, the output current IO at the first time T1 may be decreased according to Equation (5).

$$IO = e^{-\frac{t}{\tau}} \times Ipeak \times \cos(\omega t - \theta) \qquad \text{Equation (5)}$$

In Equation (5), ω denotes a resonant frequency of the load 140, t denotes time, θ denotes a phase of the output current IO, Ipeak denotes a peak value of the output current IO of a powering period, and τ denotes a time constant and may be calculated by Equation (6).

$$\tau = \frac{2Q}{\omega} = \frac{Q}{\pi} \times T \qquad \text{Equation (6)}$$

In Equation (6), T denotes a single period of the output voltage VO or the output current IO. Referring to Equations (5) and (6) and FIG. 19, the output current IO has an envelope that decreases exponentially depending on the time constant τ after the first time T1. As an example, a time point at which the magnitude of the envelope of the output current IO decreases to 10% of the maximum value is 0.73 QT.

When a lower limit of the power supplied to the load 140 in an operating state is set to 10% of a maximum, a length of a freewheeling period may have an upper limit of 0.73 QT. The upper limit of the freewheeling period may be determined by a period of the quality factor Q and the output voltage VO or the output current IO. As an example, when the quality factor Q of the load 140 varies in real time, an upper limit of the freewheeling period may also vary in real time. In this case, the upper limit of the freewheeling period may be determined based on a time at which the quality factor Q is lowest.

For example, the quality factor Q may vary in real time while the load 140 operates and the lower limit of the quality factor Q may be 5. In this case, the upper limit of the freewheeling period may be 3.65 T. The upper limit of the freewheeling period may be determined to be 3.65 T, regardless of what state the load 140 is in and what the quality factor (Q) of the load 140 has.

Figure 20:
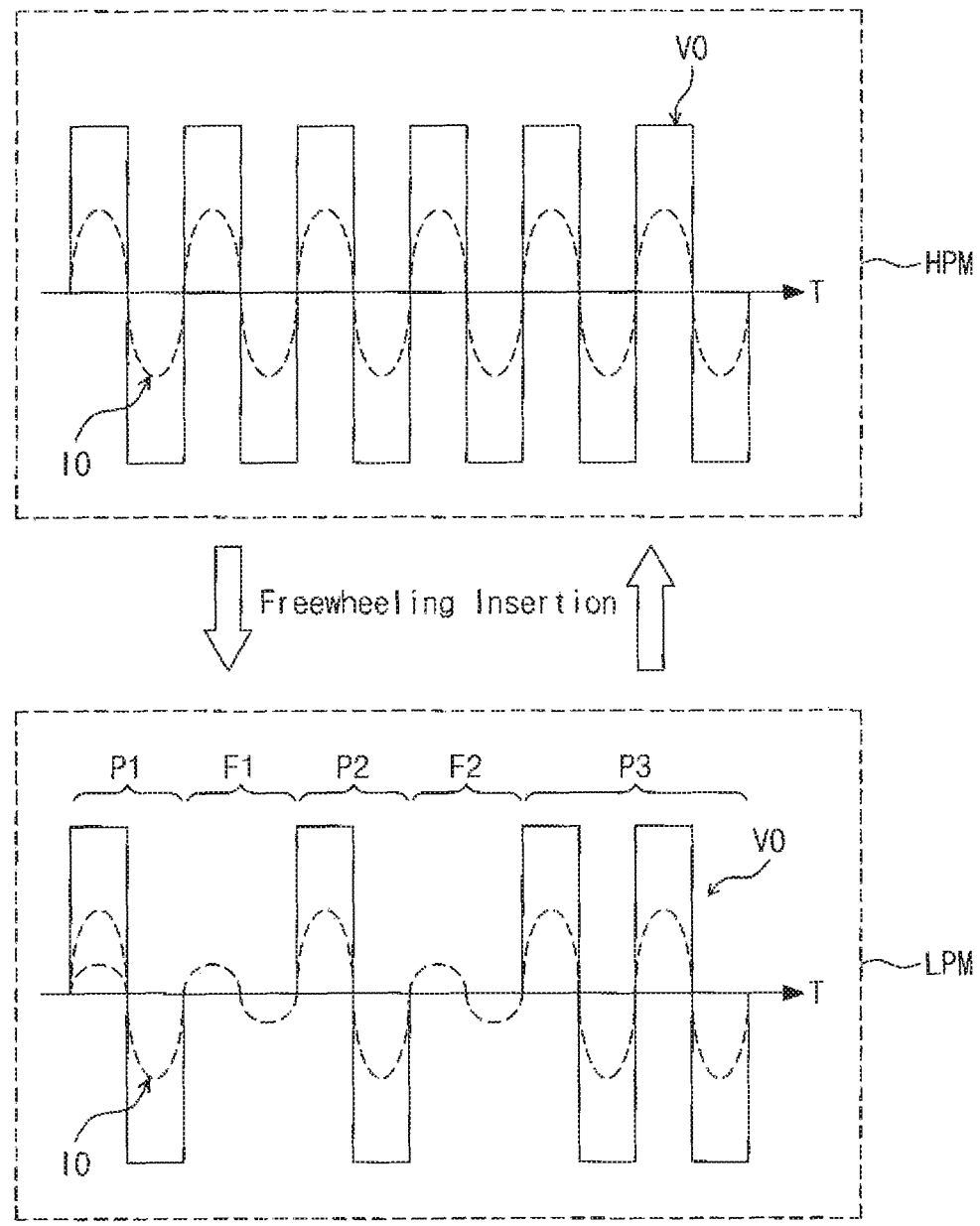
FIG. 20 illustrates an example in which a freewheeling period is divided into two or more periods.

In the case in which a required length of the freewheeling period is greater than the upper limit of the freewheeling period, the controller 125 may divide the freewheeling period into two or more freewheeling periods. FIG. 20 illustrates an example in which a freewheeling period is divided into two or more periods. Referring to FIGS. 1, 2 and 20, the controller 125 may locate a first freewheeling period F1 between first and second powering periods P1 and P2. The controller 125 may locate a second freewheeling period F2 between second and third powering periods P2 and P3.

When the second powering period P2 is located between the first and second freewheeling periods F1 and F2, power is supplied to the load 140 during the second powering period P2. Thus, the load 140 is prevented from being turned off by the first freewheeling period F1 or the second freewheeling period F2.

As an example, first power may be present in the load 140 when the load 140 is fully charged. Second power may be present in the load 140 when the power charged in the load 140 by the freewheeling period is partially consumed. The power charged in the load 140 may be less than the first power even when the power is charged in the load 140 for a single period after the freewheeling period (that is, by the powering period).

Accordingly, the controller 140 may set the upper limit of the first freewheeling period F1 and the upper limit of the second freewheeling period F2 to be different from each other. For example, the controller 125 may set the upper limit of the second freewheeling period F2 to be shorter than the upper limit of the first freewheeling period F1. As another example, the controller 125 may set a lower limit to the second powering period P2 between the first and second freewheeling periods F1 and F2. For example, the controller 125 may set a lower limit of the second powering period P2 such that the power of the load 140 rises to the first power during the second powering period P2.

Figure 21:
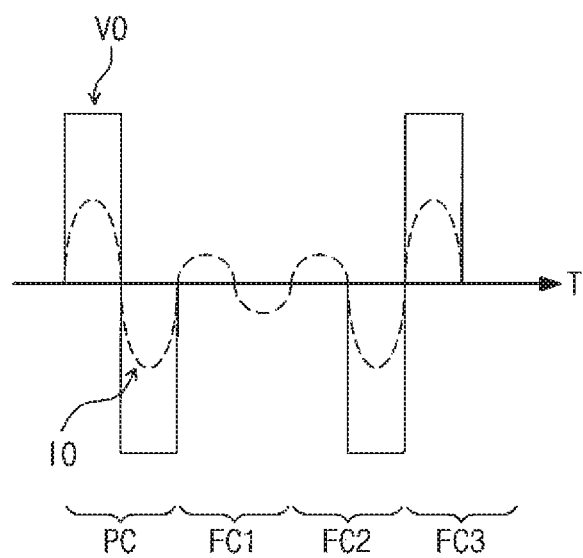
FIG. 21 illustrates examples of a powering cell and freewheeling cells.

FIG. 21 illustrates examples of a powering cell PC and freewheeling cells FC1 to FC3. Referring to FIGS. 1, 2, and 21, the powering cell PC may include a single period in which the output voltage VO fully swings. The first freewheeling cell FC1 may include a single period in which the output voltage VO is in a ground level.

The second freewheeling cell FC2 may have a half cycle in which the output voltage VO is in a ground level and a half cycle in which the output voltage VO is in a low level. The third freewheeling cell FC3 may include a half cycle in which the output voltage VO is in a high level and a half cycle in which the output voltage VO is in a ground level. The controller 125 may select one of the first to third freewheeling cells FC1 to FC3 to more precisely control the amount of power supplied to the load 140.

For example, during the powering cell (PC), the inverter 123 may supply an amount power of 1 (one). During the first freewheeling cell FC1, the inverter 123 may supply an amount of power of 0 (zero). During the second freewheeling cell FC2 or the third freewheeling cell FC3, the inverter 123 may supply an amount of power of 0.5. The controller 125 may combine the powering cell PC with the first to third freewheeling cells FC1 to FC3 to control the amount of power supplied to the load 140 in a plurality of steps.

As an example, as shown in the second and third freewheeling cells FC2 and FC3, the freewheeling cell may include at least one half cycle in which the output voltage VO is in a high or low level. During the at least one half cycle, the inverter 123 supplies power to the load 140. Accordingly, as described with reference to FIGS. 18 to 19, the load 140 may be prevented from being turned off by the freewheeling period even when an upper limit of the freewheeling period is not set.

Figure 22:
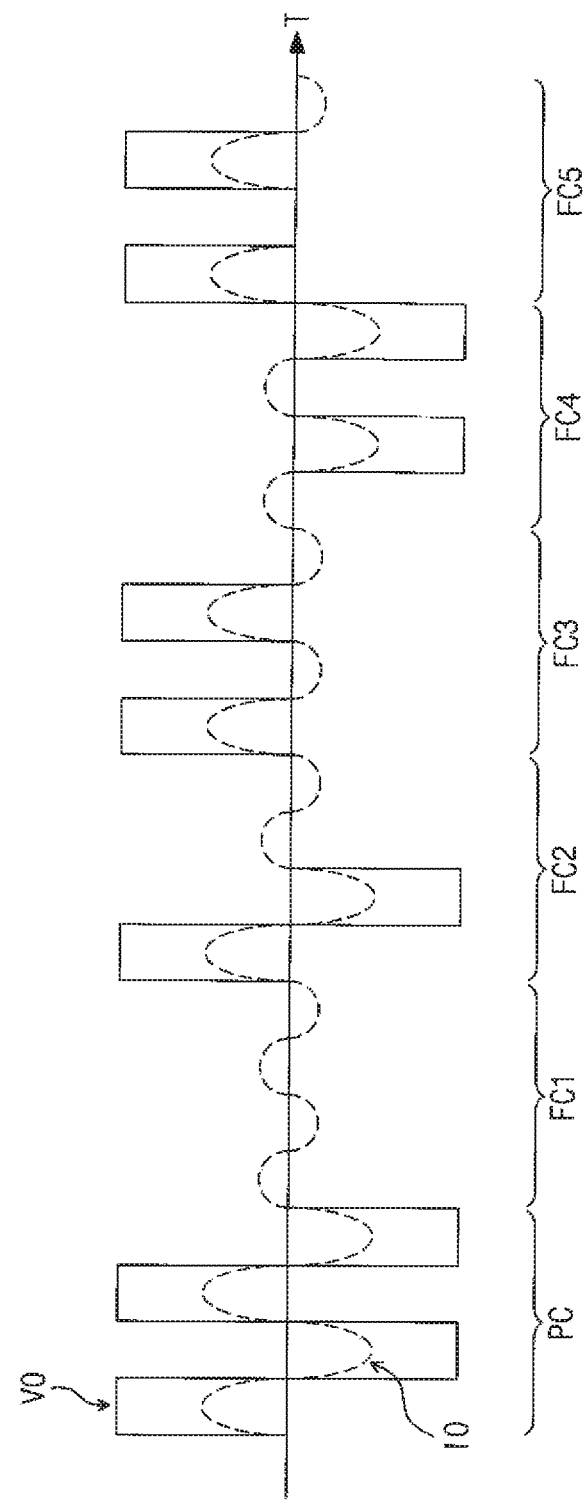
FIG. 22 illustrates other examples of a powering cell and freewheeling cells.

FIG. 22 illustrates other examples of a powering cell and freewheeling cells.

Referring to FIGS. 1, 2, and 22, each of the powering cell PC and the freewheeling cells FC1 to FC5 may include two periods of the output voltage VO or the output current IO. The freewheeling cells FC1 to FC5 include at least one half cycle in which the output voltage VO has a high level or a low level and at least one half cycle in which the output voltage VO has a ground level.

As shown in FIG. 22, the freewheeling cells FC1 to FC5 may have various patterns. The patterns of the output voltage VO of the freewheeling cells FC1 to FC5 are not limited. The number of periods of the output voltage VO or the output current IO included in each of the freewheeling cells FC1 to FC5 is not limited.

Figure 23:
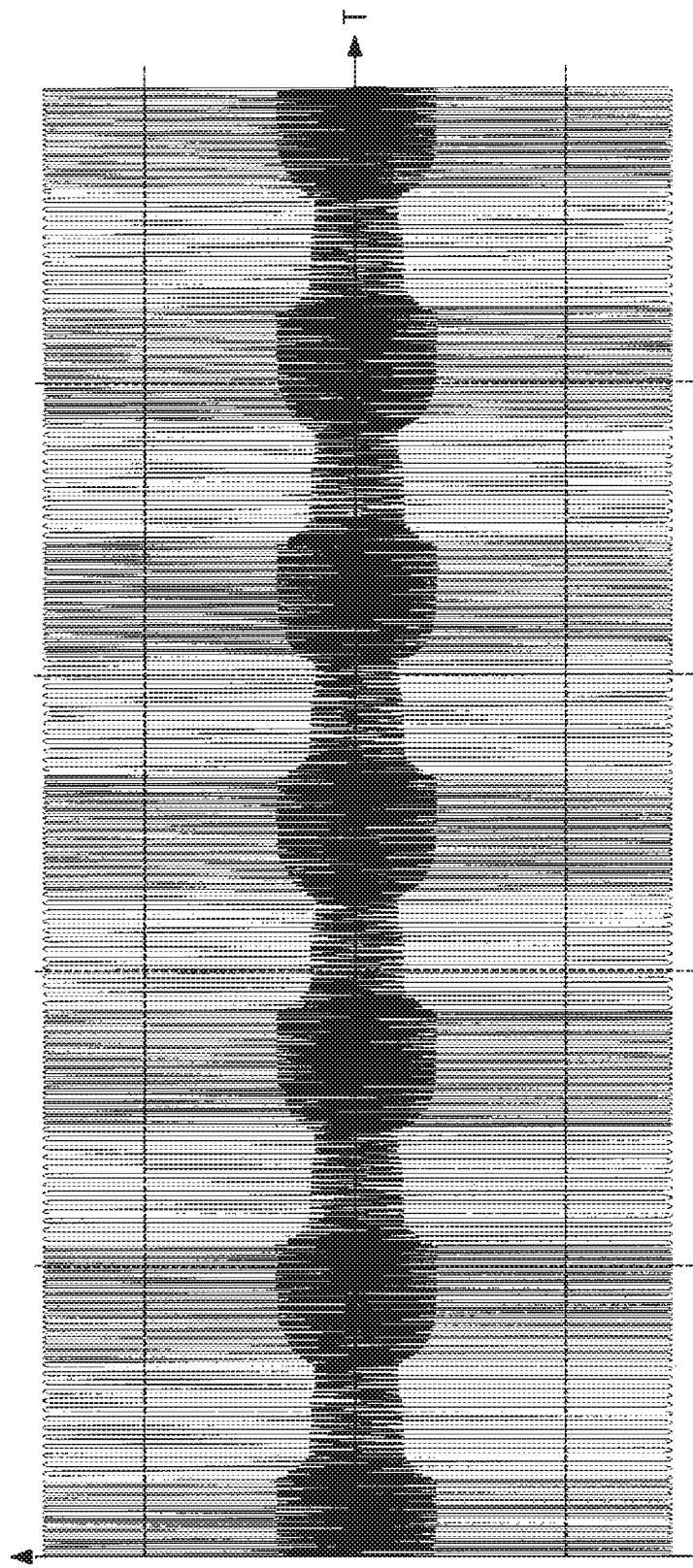
FIG. 23 illustrates an example in which a ripple is generated by powering cells and freewheeling cells.

FIG. 23 illustrates an example in which a ripple is generated by powering cells and freewheeling cells. In FIG. 23, a vertical axis denotes time T and a horizontal axis denotes an output voltage VO or an output current IO. In FIG. 23, red lines denote the output voltage VO and blue lines denote the output current IO.

Referring to FIGS. 1, 2 and 23, the controller 125 may continuously arrange freewheeling cells FC and may successively arrange powering cells PC. When the freewheeling cells FC are successively arranged, a density of the output voltage VO decreases and the amount of the output current IO decreases. When the powering cells PC are successively arranged, the density of the output voltage VO increases and the amount of the output current IO increases.

That is, when the freewheeling cells FC are arranged to be concentrated and the powering cells PC are arranged to be concentrated, ripples may occur in the output current IO. When a ripple occurs in the output current IO, it may become difficult to calculate the current amount of power.

Figure 24:
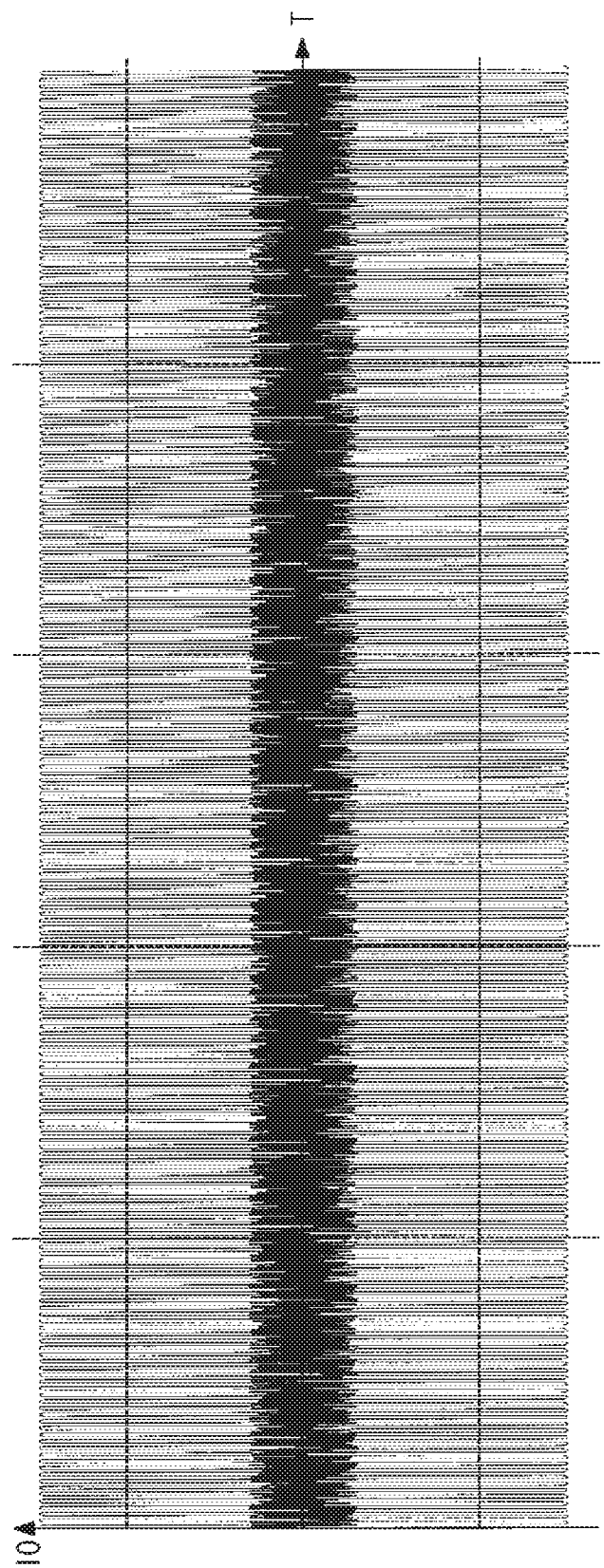
FIG. 24 illustrates an example in which a ripple is suppressed in an output current.

FIG. 24 illustrates an example in which a ripple is suppressed in an output current. In FIG. 24, a vertical axis denotes time T and a horizontal axis denotes an output voltage VO or an output current IO. In FIG. 24, red lines denote the output voltage VO and blue lines denote the output current IO.

Referring to FIGS. 1, 2, and 24, the controller 125 may locate a freewheeling cell FC next to a powering cell PC and locate a powering cell PC next to the freewheeling cell FC. For example, the controller 125 may alternately locate a freewheeling interval included in the freewheeling cell FC and a powering interval included in the powering cell PC. When the freewheeling cell FC and the powering cell PC are alternately located, ripples of the output current IO may be suppressed and the amount of power may be easily calculated.

Figure 25:
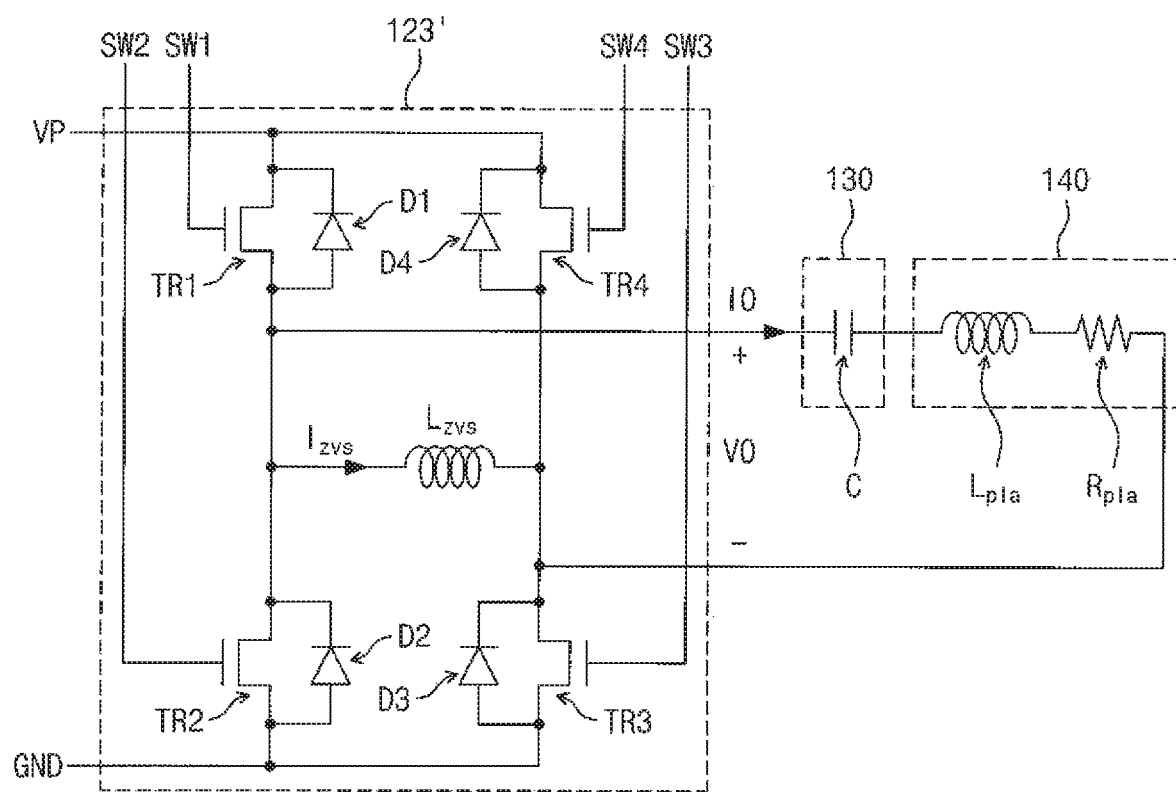
FIG. 25 illustrates an inverter, an impedance matching circuit, and a load according to an application example of the present disclosure.

FIG. 25 illustrates an inverter 123', an impedance matching circuit 130, and a load 140 according to an application example of the present disclosure. Referring to FIGS. 1 and 25, the inverter 123' may include first to fourth transistors TR1 to TR4, first to fourth diodes D1 to D4, and an inductor Lzvs.

As compared to the inverter 123 in FIG. 2, the inverter 123' further includes an inductor Lzvs. The inductor Lzvs may be coupled between output nodes to which the output voltage VO is output. A current flowing through the inductor Lzvs may be an inductor current Izvs. The first to fourth transistors TR1 to TR4 and the first to fourth diodes D1 to D4 may be connected and operate the same as those described with reference to FIG. 2.

Figure 26:
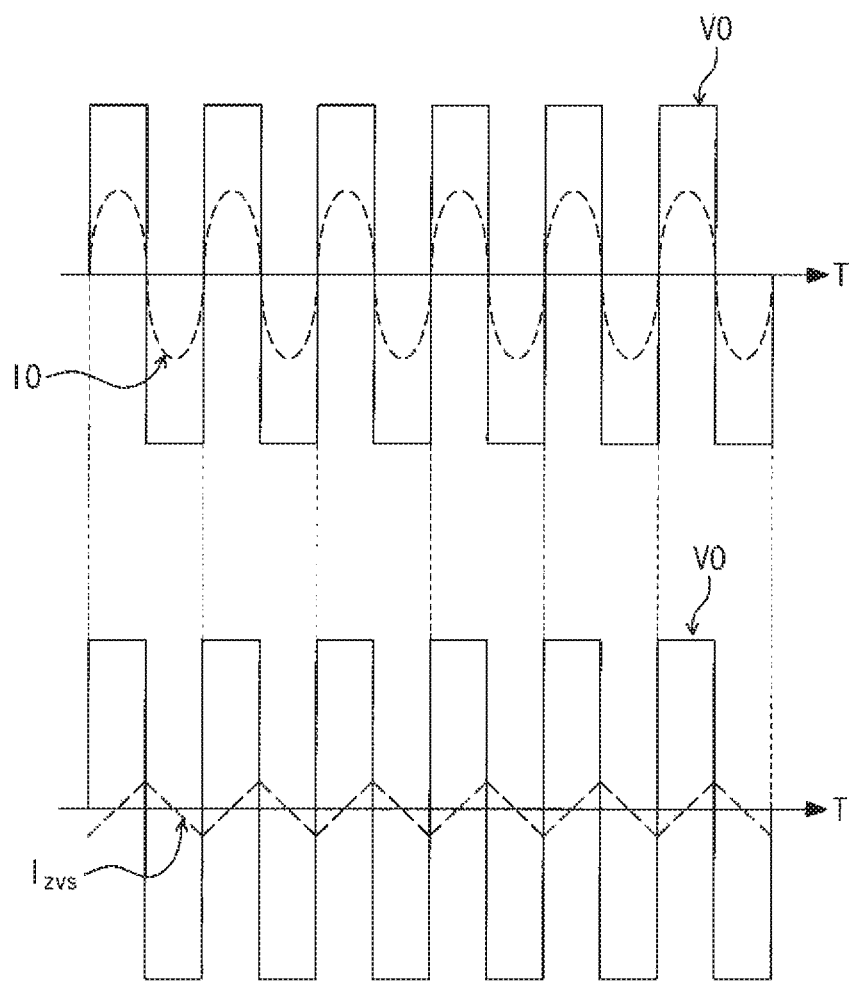
FIG. 26 illustrates variations in an output current and an inductor current with the lapse of time.

FIG. 26 illustrates variations in an output current IO and an inductor current Izvs with the lapse of time T. FIGS. 1, 25, and 26, a phase of the output voltage VO may match a phase of the output current IO. The inductor current Izvs may act as a counter electromotive force of the output current IO. The inductor current Izvs has a negative value when the output current IO increases, and the inductor current Izvs may have a positive value when the output current IO decreases.

When the phases of the output voltage VO and the output current IO match each other, the output current IO may not flow during a dead time DT (see FIG. 4) in which the output voltage VO transitions from a high level to a low level. At this point, a positive current flows in the inverter 123' due to the inductor current Izvs.

Similarly, when the phases of the output voltage VO and the output current IO match each other, the output current IO may not flow during a dead time in which the output voltage VO transitions from a low level to a high level. At this point, a negative current flows in the inverter 123' due to the inductor current Izvs. Zero voltage nearly zero current switching (ZVZCS) may be achieved in the inverter 123' due to the inductor current Izvs.

Figure 27:
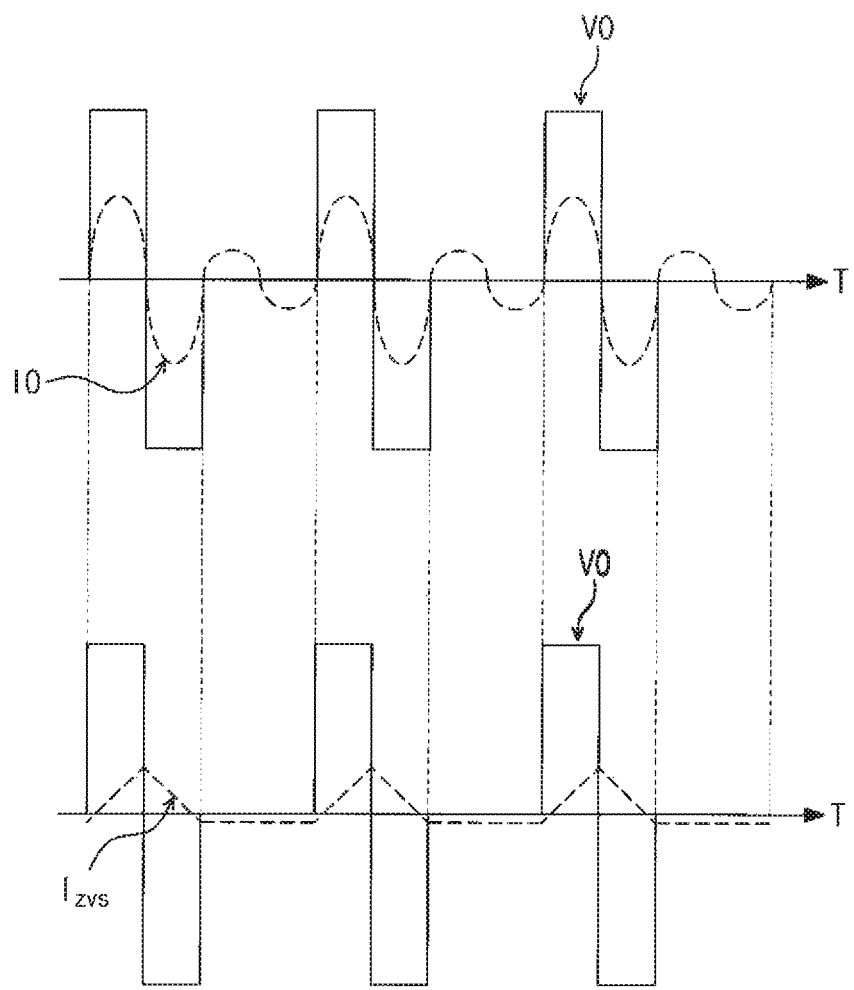
FIG. 27 illustrates an example of a variation in an inductor current when an output voltage has a freewheeling period.

FIG. 27 illustrates an example of a variation in an inductor current Izvs when an output voltage VO has a freewheeling period. Referring to FIGS. 1, 25, and 27, a powering period of one cycle and a freewheeling period of one cycle may be alternately arranged. The inductor current Izvs may be calculated using Equation (7).

$$I_{ZVS} = I\text{ini} + \frac{1}{L_{ZVS}} \int_0^\tau VO(t)dt \qquad \text{Equation (7)}$$

In Equation (7), Iini denotes an initial current. During the freewheeling interval, the inductor current Izvs remains negative. Since the sum total (or average current) of the inductor currents Izvs should be zero, an absolute value of a positive peak value of the inductor current Izvs may be greater than an absolute value of a negative peak value of the inductor current Izvs. When the amount of inductor current Izvs flowing during the dead time DT varies, the inverter 123' may non-uniformly operate. Accordingly, the amount of current of the inductor current Izvs flowing during the dead time DT is preferably uniform.

As an example, in FIG. 27, one freewheeling cell may include one period in which the output voltage VO has a ground level. FIG. 27 shows three powering cells and freewheeling cells. As another example, one freewheeling cell may include one period in which the output voltage VO has a high level and a low level, and one period in which the output voltage VO has a ground level. FIG. 27 shows three freewheeling cells.

Figure 28:
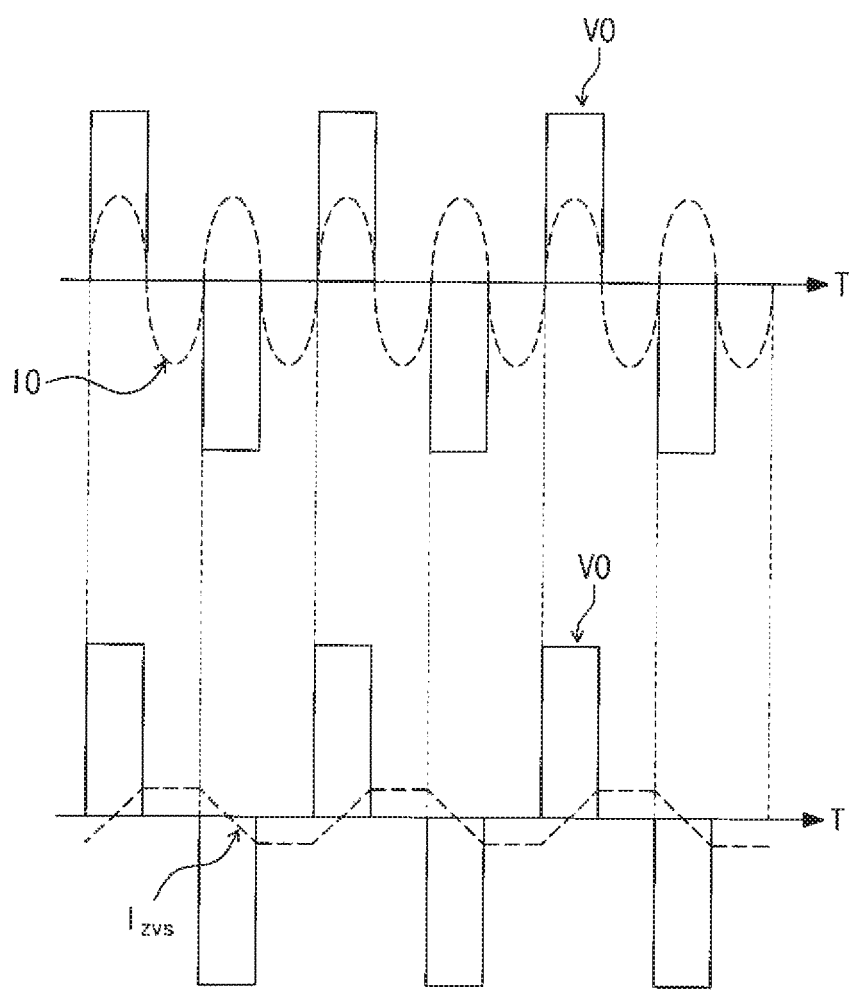
FIG. 28 illustrates another example of a variation in an inductor current when an output voltage has a freewheeling period.

FIG. 28 illustrates another example of a variation in an inductor current Izvs when an output voltage VO has a freewheeling period. Referring to FIGS. 1, 25, and 28, a powering period of a half cycle and a freewheeling period of a half cycle may be alternately arranged. In FIG. 28, a positive peak value and a negative peak value of the inductor current Izvs match each other.

However, when the output voltage VO has a negative value, the output current IO has a positive value. Power is supplied from the load 140 to the inverter 123 when the output voltage VO and the output current IO have phases opposite to each other, which may result in unnecessary power consumption and may cause the load 140 to be turned off. Accordingly, the phases of the output voltage VO and the output current IO preferably have the same sign.

As an example, in FIG. 28, a freewheeling cell may include a half-cycle in which the output voltage VO has a high level, a half-cycle in which the output voltage VO has a ground level, a half-cycle in which the output voltage VO has a low level, and a half-cycle in which in which the output voltage VO has a ground level. For example, FIG. 28 may show three freewheeling cells.

Figure 29:
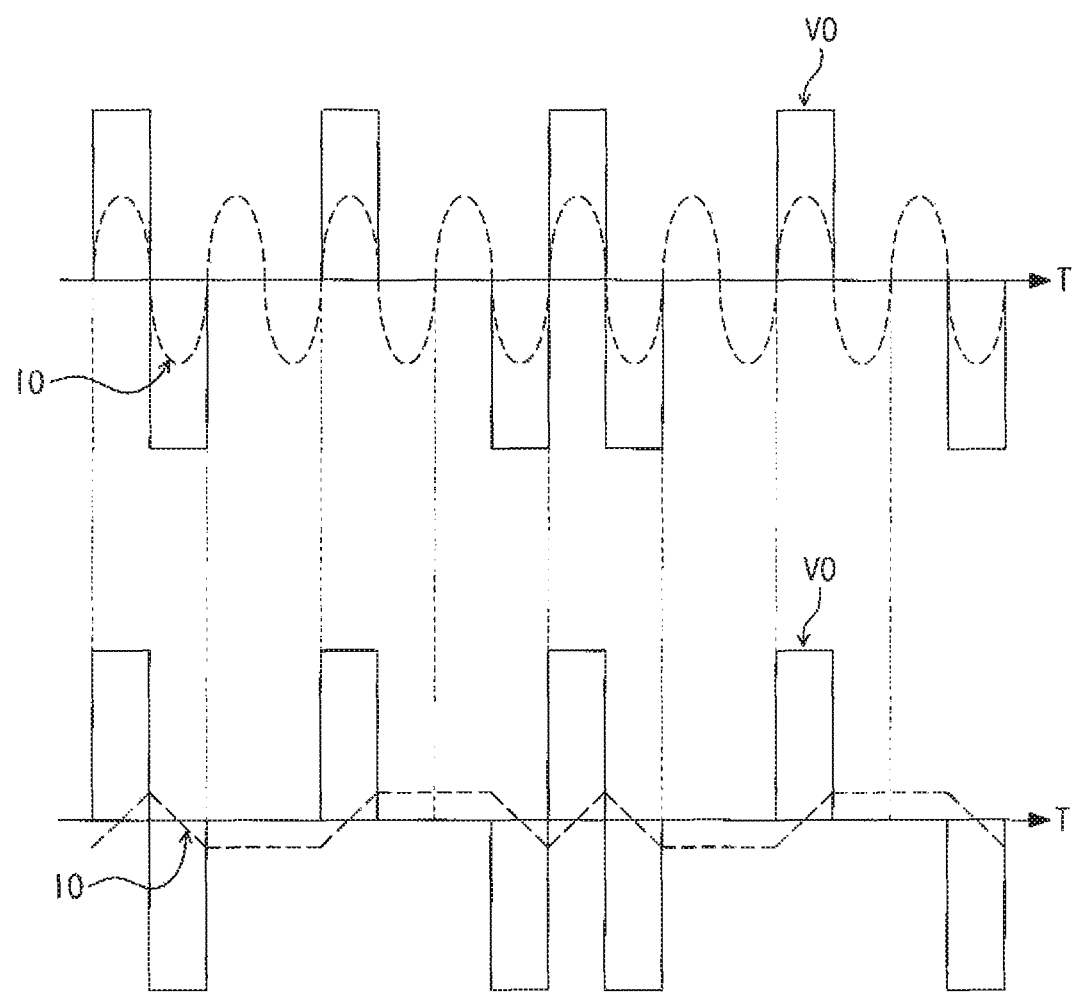
FIG. 29 illustrates another example of a variation in an inductor current when an output voltage has a freewheeling period.

FIG. 29 illustrates another example of a variation in an inductor current Izvs when an output voltage VO has a freewheeling period. Referring to FIGS. 1, 25, and 29, a single freewheeling cell may have four cycles. Two freewheeling cells are shown in FIG. 29.

A freewheeling cell includes one cycle in which the output voltage VO has a high level and a low level, one cycle in which the output voltage VO is in a ground level, one cycle in which the output voltage VO is in a high level and a ground level, and one period in which the output voltage VO is in a ground level and a low level. A positive peak value and a negative peak value of the inductor current Izvs match each other. Additionally, a sign of the output voltage VO and a sign of an output current IO match each other.

As illustrated in FIG. 29, a controller 125 may control a frequency fsw of the output voltage VO such that the frequency fsw of the output voltage VO and a resonant frequency f0 of a load 140 match each other. Zero voltage nearly zero current switching (ZVZCS) may be achieved by inductors an inductor Lzvs. Also the controller 125 may control freewheeling cells such that a positive peak value and a positive peak value of the inductor current Izvs match each other. The controller 125 may control freewheeling cells such that the sign of the output voltage VO and the sign of the output current IO match each other.

Figure 30:
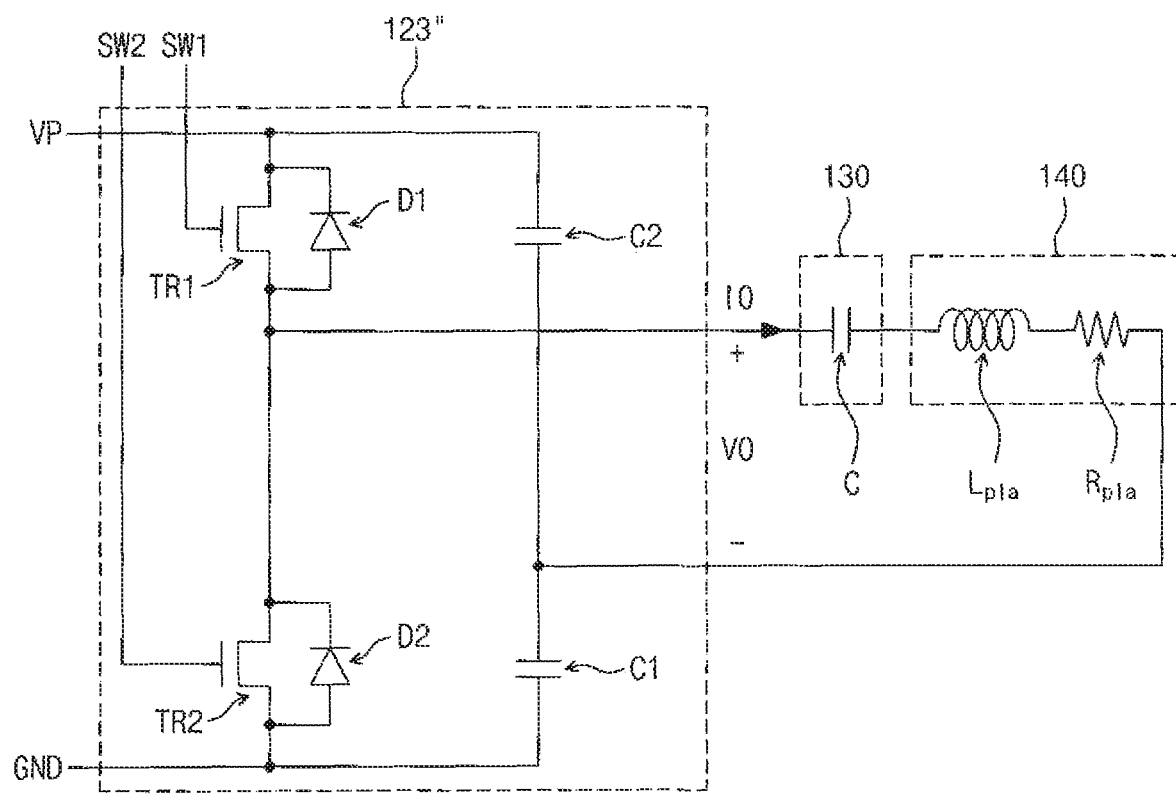
FIG. 30 illustrates an inverter, an impedance matching circuit, and a load according to an application example of the present disclosure in more detail.

FIG. 30 illustrates an inverter 123", an impedance matching circuit 130, and a load 140 according to an application example of the present disclosure in more detail. Referring to FIGS. 1 and 30, the inverter 123" includes first and second transistors TR1 and TR2, first and second diodes D1 and D2, and first and second capacitors C1 and C2. The impedance matching circuit 130 includes a capacitor C, and the load 140 may be modeled as an inductor Lpla and a resistor Rpla.

As compared to the inverter 123 in FIG. 2, in the inverter 123" in FIG. 30, a first capacitor C1 is disposed instead of the third transistor TR3 and the third diode D3 and a second capacitor C2 is disposed instead of the fourth transistor TR4 and the fourth diode D4. Each of the first and second capacitors C1 and C2 has a capacitance high enough to have a both end voltage that is substantially direct current (DC). The inverter 123" in FIG. 30 may be a half bridge type having half the output voltage range and having half a switch and switching signals, as compared to the inverter 123 in FIG. 2.

The inventive concept of the present disclosure for adjusting the powering period and the freewheeling period described with reference to FIG. 14 to FIG. 24 may be identically applied to the inverter 123" in FIG. 30. Additionally, as described with reference to FIG. 25, the inductor Lzvs may be applied to the inverter 123", similarly to the inverter 123'. Moreover, the power control (or supply) method described with reference to FIGS. 26 to 29 may be identically applied to the inverter 123" in FIG. 30.

As described above, according to the present disclosure, patterns of switching signals provided to an inverter of a power supply may be adjusted to control the amount of power or current supplied to a load. Thus, a power supply and a method of supplying power are provided with improved performance without increasing complexity and causing high-frequency switching noise and stress.

Although the present disclosure and its advantages have been described in detail, it should be understood that various changes, substitutions and alterations can be made herein without departing from the spirit and scope of the disclosure as defined by the following claims.

What is claimed is:

1. A power supply comprising:
    an inverter configured to direct current (DC) power into alternating current (AC) power;
    an impedance matching circuit configured to supply the AC power to a load; and
    a controller configured to adjust disposition of a powering period, in which the AC power is output, and a freewheeling period, in which the AC power is not output, to adjust a power amount of the power supplied to the load through the impedance matching circuit by the inverter.

2. The power supply as set forth in claim 1, wherein the controller controls the inverter to increase the freewheeling period when the power amount of the power supplied by the inverter is greater than a target power amount.

3. The power supply as set forth in claim 1, wherein the controller controls the inverter to decrease the freewheeling period when the power amount of the power supplied by the inverter is smaller than a target power amount.

4. The power supply as set forth in claim 1, wherein the controller increases or decreases the freewheeling period step by step until the power amount of the power supplied by the inverter becomes equal to a target power amount.

5. The power supply as set forth in claim 1, wherein the controller detects a difference between the power amount of the power supplied by the inverter and a target power amount and adjusts the freewheeling period according to the detected difference such that the power amount of the power supplied by the inverter becomes equal to a target power amount.

6. The power supply as set forth in claim 1, wherein the controller calculates a difference between the power amount of the power supplied by the inverter and a target power amount as an error value and adjusts the freewheeling period using a current error value, previous error values, and proportional-integral-derivation (PID) gain factors.

7. The power supply as set forth in claim 1, wherein the controller limits a length of the freewheeling period to a threshold value or less.

8. The power supply as set forth in claim 7, wherein the threshold value is determined depending on a quality factor of the impedance matching circuit and the load and a period of the AC power.

9. The power supply as set forth in claim 1, wherein the controller controls placement of the powering period and the freewheeling period by placing a powering cell in which the AC power is supplied during at least one half cycle and a freewheeling cell in which the AC power is not supplied during at least one half cycle.

10. The power supply as set forth in claim 9, wherein the controller is configured to alternately arrange the powering cell and the freewheeling cell.

11. The power supply as set forth in claim 9, wherein the controller limits the number of successively arranged freewheeling cells to a threshold value or less.

12. The power supply as set forth in claim 1, wherein the controller controls placement of the powering period and the freewheeling period by placing a powering cell in which the AC power is supplied during at least one cycle and a freewheeling cell in which the AC power is not supplied and the AC power is supplied during at least one cycle.

13. The power supply as set forth in claim 1, wherein the load is an inductively coupled plasma (ICP).

14. The power supply as set forth in claim 1, wherein the controller controls the inverter to supply positive voltage during a first half period, not to supply power during a second half period, to supply negative voltage during a third half period, and not to supply power during a fourth half period.

15. The power supply as set forth in claim 1, wherein the controller controls the inverter to supply positive voltage during a first half period, to supply negative voltage during a second half period, not to supply power during third and fourth half periods, to supply positive voltage during a fifth half period, not to supply power during sixth and seventh half period, and to supply negative voltage during an eighth half period.

16. The power supply as set forth in claim 1, wherein the inverter comprises:
  a first transistor and a first diode coupled in parallel between a power supply node and a first output node;
  a second transistor and a second diode coupled in parallel between the first output node and a ground node;
  a third transistor and a third diode coupled in parallel between the ground node and a second output node;
  a fourth transistor and a fourth diode coupled in parallel between the power supply node and the second output node; and
  an inductor coupled between the first output node and the second output node,
  the first output node and the second output node are connected to the impedance matching circuit, and
  the controller controls respective voltages of gates of the first to fourth transistors.

17. The power supply as set forth in claim 16, wherein the controller controls the inverter such that signs of a voltage and a current of the AC power match each other and such that a positive peak value and a negative peak value of a current flowing through the inductor match each other.

18. The power supply as set forth in claim 1, wherein the controller is configured to alternately arrange the powering period and the freewheeling period.

19. A method of supply power to a load, the method comprising:
  receiving a target power amount;
  comparing a power amount of power supplied to the load with the target power amount;
  adjusting a powering period, in which alternating current (AC) power is supplied to the load, and a freewheeling period, in which the AC power is not supplied to the load, depending on a comparison result such that the target power amount and the power amount become equal to each other; and
  supplying power to the load according to the adjusted powering period and the adjusted freewheeling period.

20. The method as set forth in claim 19, wherein the powering period and the freewheeling period are adjusted until the power amount and the target power amount become equal to each other.

* * * * *